(12) United States Patent
Ueda et al.

(10) Patent No.: US 6,242,336 B1
(45) Date of Patent: Jun. 5, 2001

(54) SEMICONDUCTOR DEVICE HAVING MULTILEVEL INTERCONNECTION STRUCTURE AND METHOD FOR FABRICATING THE SAME

(75) Inventors: Tetsuya Ueda; Eiji Tamaoka, both of Osaka; Nobuo Aoi, Hyogo, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/186,067

(22) Filed: Nov. 5, 1998

(30) Foreign Application Priority Data

Nov. 6, 1997 (JP) .................................................. 9-304264
Dec. 12, 1997 (JP) .................................................. 9-341011
Jun. 4, 1998 (JP) .................................................. 10-155683

(51) Int. Cl.[7] ................................................. H01L 21/4763
(52) U.S. Cl. .................... 438/619; 438/189; 438/411; 438/190; 438/191
(58) Field of Search .................................. 438/189, 190, 438/411, 191, 619, 622, 421; 257/762, 763, 764, 765, 345, 346, 347; 437/65, 235, 238, 927

(56) References Cited

U.S. PATENT DOCUMENTS

| | | | |
|---|---|---|---|
| 5,126,817 | * 6/1992 | Baba et al. | 257/347 |
| 5,148,260 | * 9/1992 | Inou | 257/762 |
| 5,171,713 | * 12/1992 | Matthews | 437/189 |
| 5,232,866 | * 8/1993 | Beyer et al. | 437/62 |
| 5,324,683 | * 6/1994 | Fitch et al. | 437/65 |
| 5,438,015 | * 8/1995 | Lur | 437/62 |
| 5,466,630 | * 11/1995 | Lur | 437/62 |
| 5,510,645 | * 4/1996 | Fitch et al. | 257/522 |
| 5,665,250 | * 9/1997 | Iwata et al. | 438/52 |
| 5,814,888 | 9/1998 | Nishioka et al. . | |
| 6,130,151 | * 10/2000 | Lin et al. | 438/619 |

FOREIGN PATENT DOCUMENTS

| | | | | |
|---|---|---|---|---|
| 2009775 | * | 1/1979 | (FR) | 23/52 |
| 52-089075 | * | 7/1977 | (JP) | 29/40 |
| 47019777 | * | 1/1979 | (JP) | 29/48 |
| 62-5643 | | 12/1987 | (JP) . | |
| 03159124 | | 7/1991 | (JP) . | |
| 05109908 | | 4/1993 | (JP) . | |
| 06125009 | | 5/1994 | (JP) . | |
| 06314687 | | 11/1994 | (JP) . | |
| 07221180 | | 8/1995 | (JP) . | |
| 08213392 | | 8/1996 | (JP) . | |
| 09055431 | | 2/1997 | (JP) . | |

* cited by examiner

Primary Examiner—Charles Bowers
Assistant Examiner—Laura M Schillinger
(74) Attorney, Agent, or Firm—McDermott, Will & Emery

(57) ABSTRACT

A method for fabricating a semiconductor device having a multilevel interconnection structure according to the present invention includes the steps of: covering a surface of a substrate with an insulating film; depositing a conductive film on the insulating film; forming a first interlevel dielectric film on the conductive film; forming an interlevel contact hole in the first interlevel dielectric film so as to reach the conductive film; filling in the interlevel contact hole with an interconnecting metal; forming a masking layer, defining a pattern of a first interconnect layer, on the first interlevel dielectric film so as to cover at least part of the interconnecting metal; forming the first interconnect layer out of the conductive film by etching the first interlevel dielectric film using the masking layer as a mask and by etching the conductive film using the masking layer and the interconnecting metal as a mask; removing the masking layer; depositing a second interlevel dielectric film over the substrate so as to cover the interconnecting metal and the first interconnect layer; planarizing the second interlevel dielectric film, thereby exposing at least part of the interconnecting metal; and forming a second interconnect layer to be electrically connected to an upper part of the interconnecting metal.

14 Claims, 21 Drawing Sheets

US 6,242,336 B1

SEMICONDUCTOR DEVICE HAVING MULTILEVEL INTERCONNECTION STRUCTURE AND METHOD FOR FABRICATING THE SAME

BACKGROUND OF THE INVENTION

The present invention relates to a semiconductor device having a multilevel interconnection structure and a method for fabricating the same.

Recent amazing progress in semiconductor processing technologies enabled super-miniaturization and a very high degree of integration of lines and devices. As a result, the performance of a ULSI has also been enhanced by leaps and bounds. However, the larger the number of lines integrated is, the more dependent the speed of a device is on the delay of a signal transmitted through the lines. In order to reduce such a delay as much as possible, various materials with lower relative dielectric constants such as fluorine-doped SiOF (the relative dielectric constant $\in$ is about 3.5; that of fluorine is relatively low) and SiO:C containing an organic material ($\in$ is in the range from 2.8 to 3.2) are now replacing conventionally used $SiO_2$ ($\in$ is 4.3) as materials for an interlevel dielectric film of a ULSI. These materials, however, have problems in terms of hygroscopicity and thermal resistance. Accordingly, it is difficult to effectively organize a process by using these materials.

In addition, in order to reduce a line-to-line delay particularly affecting the speed of a device, a technique for decreasing a relative dielectric constant between lines by intentionally providing an air gap, filled with the air ($\in$ is 1.0), for a dielectric between the lines was also proposed (see Japanese Laid-Open Publication No. 62-5643). Hereinafter, this technique will be described with reference to FIG. 17. FIG. 17 is a cross-sectional view illustrating the structure of a conventional semiconductor device. As shown in FIG. 17, air gaps 6 and 7 are respectively provided between lines 3 and 4 and between lines 4 and 5 for a dielectric 2 on a semiconductor substrate 1 of the semiconductor device. The dielectric 2 is $SiO_2$, for example. The capacitance between the lines 3 and 4 can be regarded as the serial connection of the capacitance between the line 3 and the air gap 6, the capacitance of the air gap 6 itself, and the capacitance between the air gap 6 and the line 4. The relative dielectric constant of the air gaps 6 and 7 filled with the air is about one-fourth as large as that of $SiO_2$ as the dielectric 2. In this manner, the capacitance between adjacent lines can be reduced by providing air gaps and therefore the delay of a signal can be suppressed between the adjacent lines. As a result, a semiconductor device, which has a larger operating margin and is less likely to operate erroneously, is realized. In addition, since no new material needs to be used, the process can be carried out with lower costs.

In the conventional structure, however, lines and interlevel contact holes are designed in a "borderless" manner, i.e., such that the width of a line is equal to the diameter of an interlevel contact hole. Accordingly, if misalignment is caused during a photolithography process, the following problems are created. First, in opening an interlevel contact hole, the interlevel contact hole is adversely joined with an associated air gap. Since an interconnecting metal, filled in the interlevel contact hole, enters the joined region, a shortcircuit failure is generated in the line. Second, since the contact area between the interconnecting metal, filled in the interlevel contact hole, and the line is smaller, a contact failure is more likely to happen.

These failures will be described with reference to FIGS. 18A through 18E illustrating the flow of a conventional process for fabricating a multilevel interconnection structure of a semiconductor device. First, as shown in FIG. 18A, an insulating film 12, a first interconnect layer 13 and an interlevel dielectric film 14 are formed in this order over a semiconductor substrate 11. In this case, since an $SiO_2$ film is deposited as the interlevel dielectric film 14 by a plasma CVD technique, the step coverage is poor. That is to say, the ratio of the thickness of the deposited film at a line-to-line space 15 in the first interconnect layer 13 to the thickness thereof in the planar region is low. As a result, an air gap 16 is formed at the line-to-line space 15 in the interlevel dielectric film 14. However, since the step coverage does not become 0%, the air gap does not completely occupy the line-to-line space 15 and the interlevel dielectric film 14 partially exists between the lines. Accordingly, in order to reduce the relative dielectric constant between the lines, the deposition rate of the interlevel dielectric film 14 may be further decreased at the line-to-line space 15. In such a case, the air gap 16 occupies an even larger region. Next, as shown in FIG. 18B, the interlevel dielectric film 14 is partially removed by a resist etchback technique, a chemical/mechanical polishing (CMP) technique or the like to planarize the surface of the interlevel dielectric film 14.

Then, as shown in FIG. 18C, an interlevel contact hole 17 is formed by photolithography and dry etching techniques. Assume that the width 18 of a line in the first interconnect layer 13 is equal to the diameter 19 of the interlevel contact hole 17, and that misalignment was caused during the photolithography to shift the right edge of the contact hole 17 leftward by an alignment error 20. In such a case, as a result of the misalignment, part of the interlevel contact hole 17 is joined with the air gap 16 to reach a deeper level than the upper surface of the first interconnect layer 13 in the region that has shifted leftward.

Subsequently, as shown in FIG. 18D, the interlevel contact hole 17 is filled in with an interconnecting metal 21 such as tungsten in accordance with a CVD technique. If tungsten 21 is filled in by a CVD technique in this manner, then satisfactory step coverage can be attained. Accordingly, not only the interlevel contact hole 17 shown in FIG. 18C but also the air gap 16 are filled in with tungsten 21. As a result, a shortcircuit failure is generated, because adjacent lines in the first interconnect layer 13 are unintentionally connected to each other via the interconnecting metal 21 filled in a part that used to be the air gap 16. In accordance with this method, if the relative dielectric constant in the line-to-line space 15 is reduced, then the air gap 16 occupies an even larger region. As a result, the shortcircuit failure is even more likely to happen. On the other hand, the larger the misaligned error 20 shown in FIG. 18C is, the smaller the contact area between the line in the first interconnect layer 13 and the interconnecting metal 21, filled in the interlevel contact hole 17, is. Consequently, a contact failure is caused between the line and the interconnecting metal 21. Particularly when an organic material is used for the interlevel dielectric film 14, the contact failure is much more likely to happen. Furthermore, if a deeper interlevel contact hole 17 has been formed by etching, a shortcircuit failure is generated, because a line in the first interconnect layer 13 is unintentionally connected to the semiconductor substrate 11 through the interconnecting metal 21. Thereafter, as shown in FIG. 18E, a second interconnect layer 22 is formed on the interconnecting metal 21 and the interlevel dielectric film 14 so as to be interconnected to the first interconnect layer 13 though the interconnecting metal 21.

SUMMARY OF THE INVENTION

In view of the above-described conventional problems, the present invention was made to provide a semiconductor device that can minimize line-to-line capacitance and can suppress a shortcircuit or contact failure even if misalignment has been caused, and a method for fabricating the same.

A method for fabricating a semiconductor device having a multilevel interconnection structure according to the present invention includes the steps of: covering a surface of a substrate with an insulating film; depositing a conductive film on the insulating film; forming a first interlevel dielectric film on the conductive film; forming an interlevel contact hole in the first interlevel dielectric film so as to reach the conductive film; filling in the interlevel contact hole with an interconnecting metal; forming a masking layer, defining a pattern of a first interconnect layer, on the first interlevel dielectric film so as to cover at least part of the interconnecting metal; forming the first interconnect layer out of the conductive film by etching the first interlevel dielectric film using the masking layer as a mask and by etching the conductive film using the masking layer and the interconnecting metal as a mask; removing the masking layer; depositing a second interlevel dielectric film over the substrate so as to cover the interconnecting metal and the first interconnect layer; planarizing the second interlevel dielectric film, thereby exposing at least part of the interconnecting metal; and forming a second interconnect layer to be electrically connected to an upper part of the interconnecting metal.

Another method for fabricating a semiconductor device having a multilevel interconnection structure according to the present invention includes the steps of: covering a surface of a substrate with an insulating film; depositing a conductive film on the insulating film; forming a first interlevel dielectric film on the conductive film; forming an interlevel contact hole in the first interlevel dielectric film so as to reach the conductive film; filling in the interlevel contact hole with an interconnecting metal; partially etching the first interlevel dielectric film from the surface thereof to make an upper end portion of the interconnecting metal protrude from the first interlevel dielectric film; forming a masking layer, defining a pattern of a first interconnect layer, on the first interlevel dielectric film so as to cover at least part of the interconnecting metal; forming the first interconnect layer out of the conductive film by etching the first interlevel dielectric film using the masking layer as a mask and by etching the conductive film using the masking layer and the interconnecting metal as a mask; removing the masking layer; depositing a second interlevel dielectric film over the substrate so as to cover the interconnecting metal and the first interconnect layer; planarizing the second interlevel dielectric film, thereby exposing at least part of the interconnecting metal; and forming a second interconnect layer to be electrically connected to an upper part of the interconnecting metal.

Still another method for fabricating a semiconductor device having a multilevel interconnection structure according to the present invention includes the steps of: forming a structure including: a lower-level interconnect layer composed of a plurality of lines that are formed on the same insulating film and include first, second and third lines; and a first interlevel dielectric film formed on the first, second and third lines, the second line being adjacent to and spaced apart from the first line by a first space, the third line being adjacent to and spaced apart from the first line by a second space wider than the first space; depositing a first interlevel dielectric layer as a lower part of a second interlevel dielectric film such that an upper part of the first space is substantially covered with the first interlevel dielectric layer and that an air gap is formed in the first space; and depositing a second interlevel dielectric layer, the coverage of which is more satisfactory than that of the first interlevel dielectric layer, as an upper part of the second interlevel dielectric film to fill in the second space and totally cover the air gap.

A semiconductor device having a multilevel interconnection structure according to the present invention includes: a lower-level interconnect layer composed of a plurality of lines that are formed on the same insulating film and include first, second and third lines, the second line being adjacent to and spaced apart from the first line by a first space, the third line being adjacent to and spaced apart from the first line by a second space; a first interlevel dielectric film formed on the first, second and third lines; an interconnecting metal formed in the first interlevel dielectric film to make contact with the upper surface of the first line; a second interlevel dielectric film, which is formed in upper parts of the first and second spaces and forms respective air gaps in the first and second spaces; and an upper-level interconnect layer formed on the second interlevel dielectric film and electrically connected to the interconnecting metal.

Another semiconductor device having a multilevel interconnection structure according to the present invention includes: a lower-level interconnect layer composed of a plurality of lines that are formed on the same insulating film and include first, second and third lines, the second line being adjacent to and spaced apart from the first line by a first space, the third line being adjacent to and spaced apart from the first line by a second space; a first interlevel dielectric film formed on the first, second and third lines; and a second interlevel dielectric film covering the lower-level interconnect layer and having the upper surface thereof planarized. The second space is wider than the first space. The second interlevel dielectric film includes a first interlevel dielectric layer and a second interlevel dielectric layer formed on the first interlevel dielectric layer. The upper surface of the second interlevel dielectric film is planarized. The first and second interlevel dielectric layers cover an upper part of the first space and an air gap is formed in the first space. And the second space is filled in with the first and second interlevel dielectric layers.

DESCRIPTION OF THE PREFERRED EMBODIMENTS

EMBODIMENT 1

Figure 1A:
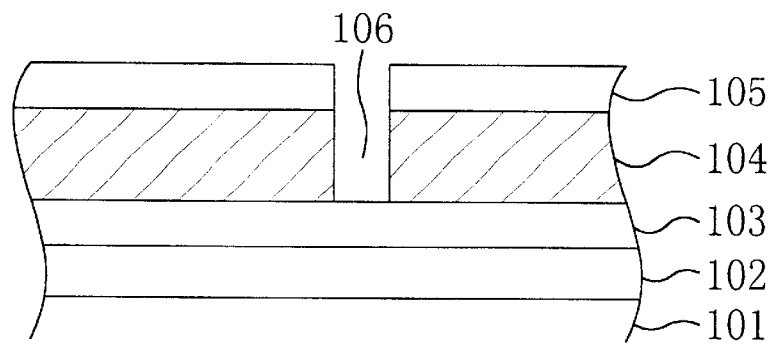
FIGS. 1A through 1G are cross-sectional views illustrating the flow of a process for fabricating a semiconductor device in the first embodiment of the present invention.

Hereinafter, the first embodiment of the present invention will be described with reference to FIGS. 1A through 1G and FIGS. 2A and 2B. FIGS. 1A through 1G are cross-sectional views illustrating the flow of a process for fabricating a semiconductor device in this embodiment. First, as shown in FIG. 1A, an insulating film 102 (thickness: 0.8 $\mu$m), a first metal layer 103 formed by alternately stacking aluminum and a titanium alloy (thickness: 0.5 $\mu$m) and a first interlevel dielectric film 104 (thickness: 1.0 $\mu$m) are deposited in this order on a semiconductor substrate 101 on which a semiconductor active element (not shown) has been formed beforehand. Thereafter, an interconnecting resist pattern 105 is formed thereon and an interlevel contact hole 106 is opened by dry etching.

Figure 1B:
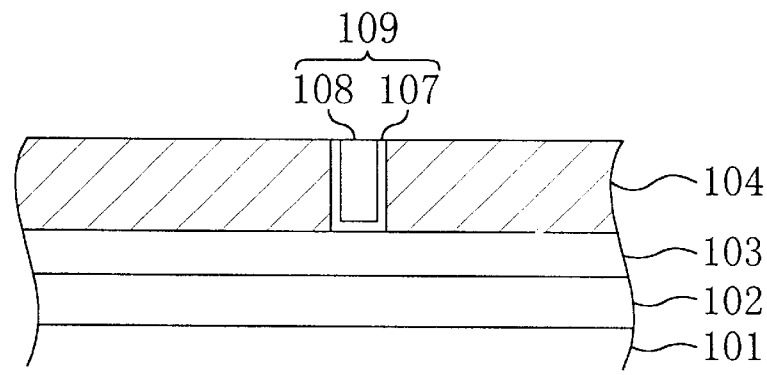

Next, as shown in FIG. 1B, the interconnecting resist pattern 105 is removed, and an adhesion layer 107 made of TiN/Ti, for example, is deposited over the entire surface of the substrate as well as over the inside of the interlevel contact hole 106. Then, an interconnecting material 108 such as tungsten is further deposited thereon by a blanket W-CVD technique. And the adhesion layer 107 and the interconnecting material 108 are removed by a dry etching or CMP technique except for the respective portions existing inside the interlevel contact hole 106. The respective portions of the adhesion layer 107 and the interconnecting material 108, existing only in the interlevel contact hole 106, constitute an interconnecting metal 109 altogether.

Figure 1C:
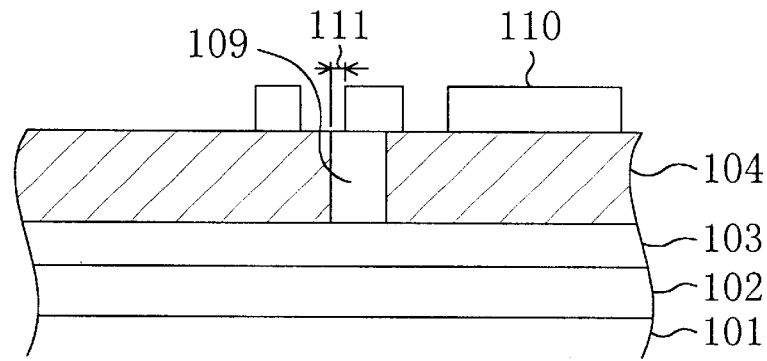

Then, as shown in FIG. 1C, a first-interconnect resist pattern 110 is formed over the first interlevel dielectric film 104 and the interconnecting metal 109. Assume the first-interconnect resist pattern 110 has been formed with an alignment error 111. If the diameter of the interlevel contact hole 106 is 0.3 $\mu$m and the line width of a recess in the first-interconnect resist pattern 110 is also 0.3 $\mu$m, then the maximum permissible alignment error 111 between the interconnecting metal 109 filled in the interlevel contact hole 106 and the first-interconnect resist pattern 110 is 0.1 $\mu$m.

Figure 2A:
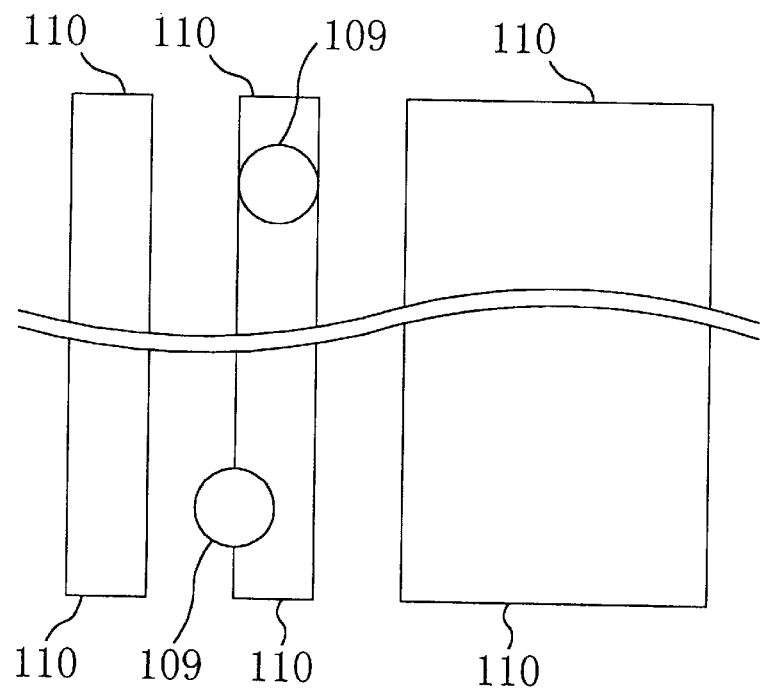
FIGS. 2A and 2B are a plan view and a perspective view illustrating how the positional relationship between a line in a first interconnect layer and an interconnecting metal changes with misalignment in the semiconductor device of the first embodiment.

FIG. 2A is a plan view illustrating how the positional relationship between the first-interconnect resist pattern 110 and the interconnecting metal 109 changes with the mask-to-mask placement error. In the lower part under the wave line in FIG. 2A, the position of the first-interconnect resist pattern 110 is misaligned with that of the interconnecting metal 109. On the other hand, in the upper part over the wave line in FIG. 2A, the position of the first-interconnect resist pattern 110 matches with that of the interconnecting metal 109.

Figure 1D:
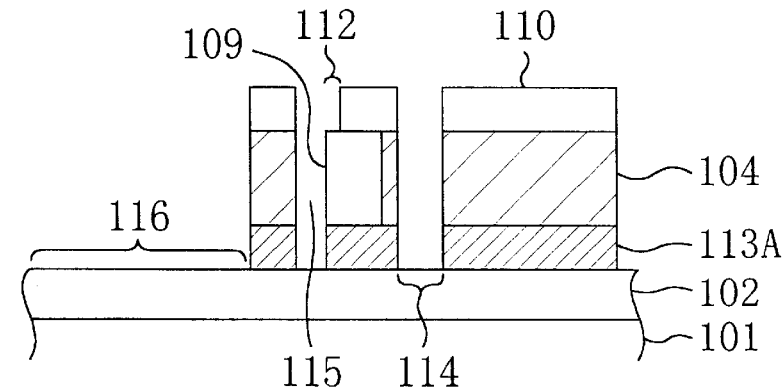

Next, as shown in FIG. 1D, the layers on the surface of the substrate, which are exposed through the first-interconnect resist pattern 110, are sequentially dry-etched by using a CF-based etching gas used for removing an oxide film and a Cl-based etching gas used for removing aluminum. First, parts of the first interlevel dielectric film 104, exposed through the openings of the first-interconnect resist pattern 110, are removed by dry etching using the CF-based etching gas at a low temperature. In this case, part of the interconnecting metal 109 corresponding to a misaligned portion 112 is not etched by the CF-based etching gas. Then, parts of the first metal layer 103, exposed through the openings of the first-interconnect resist pattern 110, are removed by dry etching using the Cl-based etching gas until the insulating film 102 is exposed. The part of the interconnecting metal 109 corresponding to the misaligned portion 112 is not etched by the Cl-based etching gas, either.

Figure 2B:
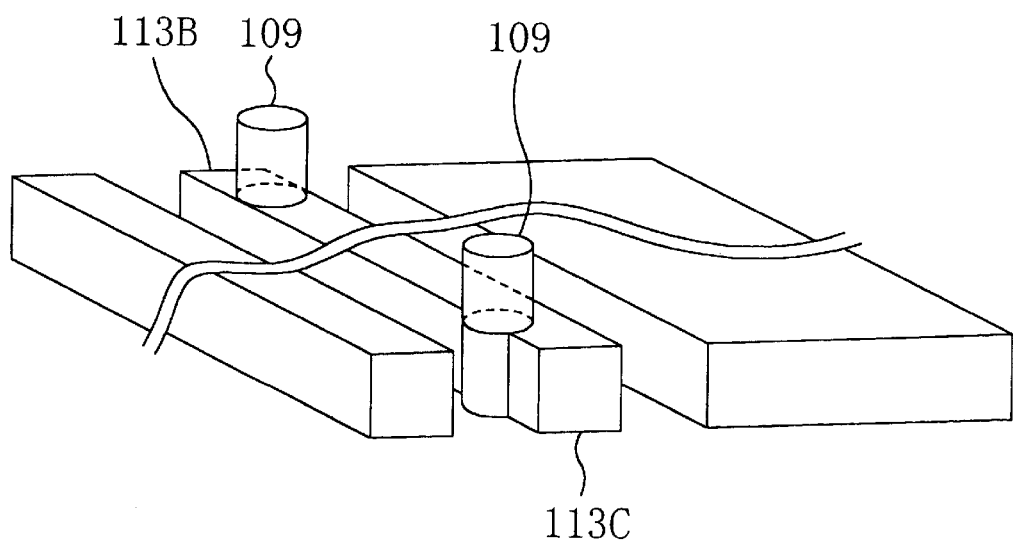

FIG. 2B is a perspective view illustrating how the positional relationship between lines in the first interconnect layer 113 and the interconnecting metal 109 changes with the mask-to-mask placement error. First, as to a line 113B that has been formed out of the first metal layer 103 by dry etching without having been misaligned, the interconnecting metal 109 having a diameter equal to the width of the line 113B is formed on the upper surface of the line 113B. On the other hand, as to a line 113C that has been formed out of the first metal layer 103 by dry etching with an alignment error, part of the first metal layer 103 located under the interconnecting metal 109 is not etched during the dry etching. Accordingly, the part of the first metal layer 103 located under the interconnecting metal 109 is not etched but left in a self-aligned manner in the misaligned portion 112 shown in FIG. 1D. As a result, a line 113C is shaped as shown in FIG. 2B. Therefore, the line 113B or 113C (both identified by 113A in FIG. 1D) of the first interconnect layer 113 is formed without fail under the entire bottom of the interconnecting metal 109. Also, since the portions under the first-interconnect resist pattern 110 are not etched, the first interlevel dielectric film 104 remains as it is in the portions over the lines 113A in the first interconnect layer 113 where the interconnecting metal 109 does not exist. That is to say, either the first interlevel dielectric film 104 or the interconnecting metal 109 always exists over the lines 113A in the first interconnect layer 113. Accordingly, portions of the first metal layer 103 existing under the interconnecting metal 109 and the first interlevel dielectric film 104 constitute the lines 113A in the first interconnect layer 113. The total thickness of the lines 113A in the first interconnect layer 113, formed out of the first metal layer 103, and the first interlevel dielectric film 104 is 1.5 μm. Thus, the aspect ratio of a recess 115 formed in a line-to-line space 114, which is a region between adjacent lines in the first interconnect layer 113 and has the minimum width of 0.3 μm, is about five. It is noted that a dummy interconnect pattern may be formed in a field portion 116 where the lines of the first interconnect layer 113 do not exist.

Figure 1E:
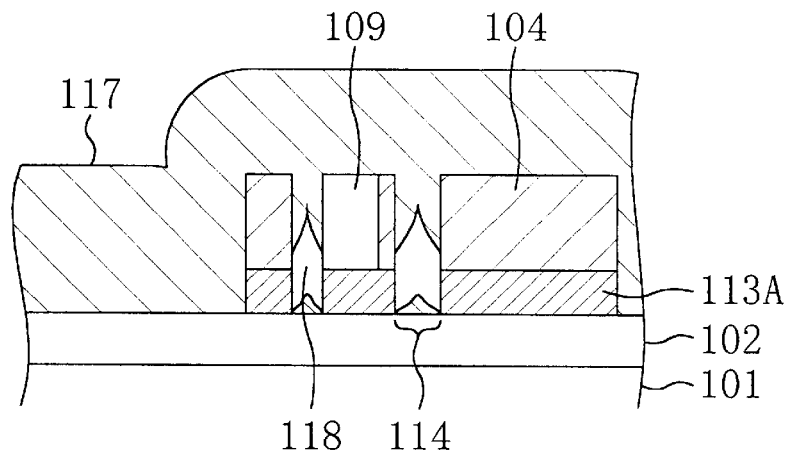

Next, as shown in FIG. 1E, the first-interconnect resist pattern 110 is removed. Then, a second interlevel dielectric film 117 is deposited over the insulating film 102, the first interlevel dielectric film 104 and the interconnecting metal 109 on the semiconductor substrate 101 by using a plasma CVD apparatus. Part or all of a recess formed in a line-to-line space 114 is not filled in with the second interlevel dielectric film 117, but forms an air gap 118. In a recess having a high aspect ratio, in particular, the entire region of a line-to-line space 114 is turned into an air gap 118.

Figure 1F:
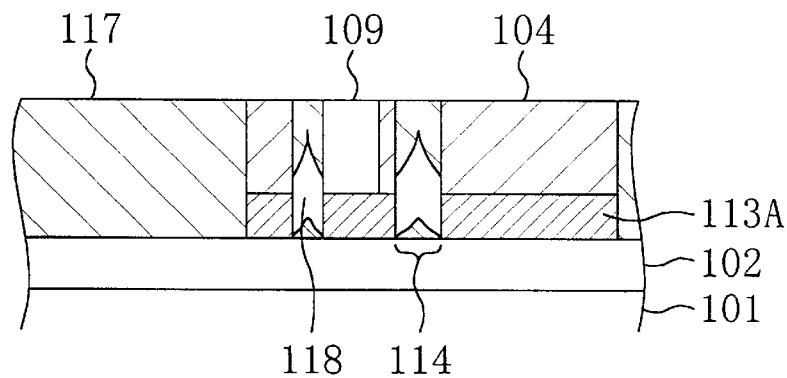

Subsequently, as shown in FIG. 1F, the surface of the second interlevel dielectric film 117 is planarized by a CMP technique such that the respective surfaces of the first interlevel dielectric film 104, the interconnecting metal 109 and the second interlevel dielectric film 117 form a single plane. In this embodiment, the first and second interlevel dielectric films 104 and 117 are made of different materials and the etching rate of the first interlevel dielectric film 104 is set smaller than that of the second interlevel dielectric film 117 during the CMP process. In this manner, the first interlevel dielectric film 104 is used as an etching stopper. Even in a recess having a high aspect ratio, the upper part thereof is filled in with the second interlevel dielectric film 117 to a certain degree. Accordingly, no opening is formed over any air gap 118 through the surface of the second interlevel dielectric film 117 after CMP is finished.

Figure 1G:
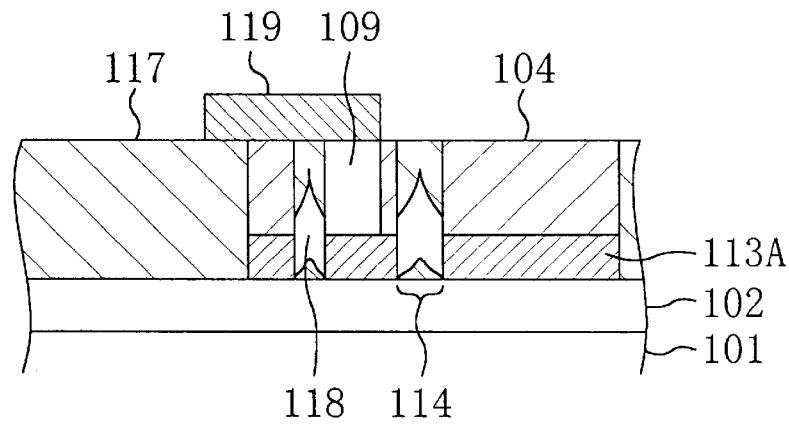

Then, as shown in FIG. 1G, a metal layer formed by alternately stacking aluminum and a titanium alloy is deposited thereon and subjected to photolithography and dry etching, thereby forming a second interconnect layer 119.

As described above, in this embodiment, part or all of a line-to-line space 114 is turned into an air gap 118. Accordingly, the relative dielectric constant between adjacent lines 113A in the first interconnect layer 113 can be reduced at the line-to-line space 114. In particular, when a recess 115 formed in a line-to-line space 114 has a high aspect ratio, the entire region of the line-to-line space 114 is turned into an air gap 118. As a result, the relative dielectric constant between adjacent lines 113A in the first interconnect layer 113 can be minimized.

In addition, since the first interconnect layer 113 is formed after the interconnecting metal 109 has been formed, the first interconnect layer 113 exists without fail under the entire bottom of the interconnecting metal 109. Accordingly, it is possible to prevent a contact failure from being caused between the first interconnect layer 113 and the interconnecting metal 109.

Moreover, after the interconnecting metal 109 has been filled in the interlevel contact hole 106 provided in the first interlevel dielectric film 104, the first interconnect layer 113 and the second interlevel dielectric film 117 are formed in this order. Accordingly, even if a mask-to-mask placement error has been caused during the formation of the first interconnect layer 113, either the interconnecting metal 109 or the first interlevel dielectric film 104 always exists on the upper surface of the first interconnect layer 113. And the interconnecting metal 109 is never filled in any air gap 118 formed simultaneously with the second interlevel dielectric film 117. Accordingly, it is possible to prevent a shortcircuit failure from being caused between adjacent lines 113A in the first interconnect layer 113 or between a line 113A and the semiconductor substrate 101 through the interconnecting metal 109.

EMBODIMENT 2

Figure 3A:
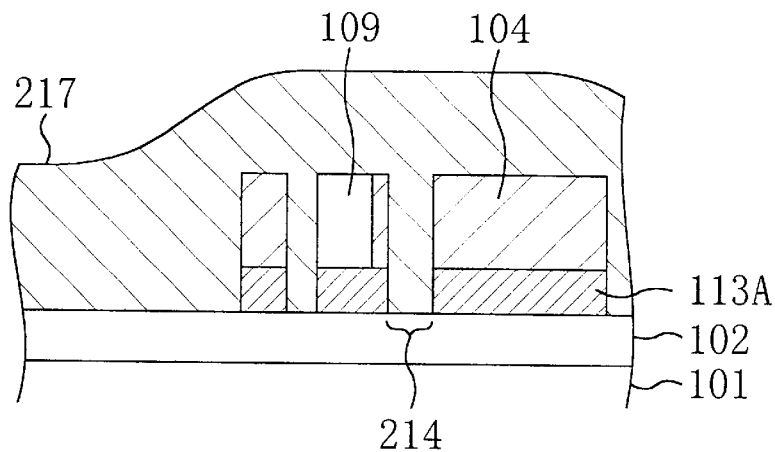
FIGS. 3A through 3C are cross-sectional views illustrating the flow of a process for fabricating a semiconductor device in the second embodiment of the present invention.
Figure 3B:
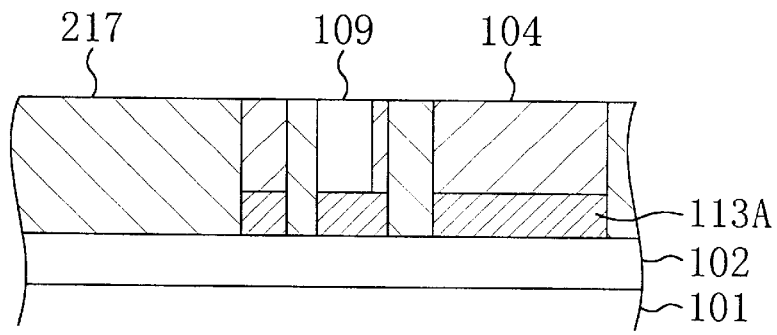
Figure 3C:
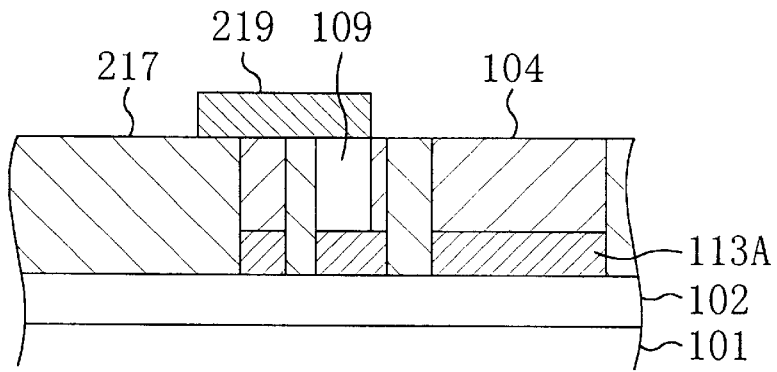

Hereinafter, the second embodiment of the present invention will be described with reference to FIGS. 3A through 3C illustrating the flow of a process for fabricating a semiconductor device in this embodiment. The same process steps as those illustrated in FIGS. 1A through 1D are also performed prior to the process step shown in FIG. 3A. Thus, the same components as those used in the first embodiment will be identified by the same reference numerals and the description thereof will be omitted herein. Unlike the first embodiment in which the second interlevel dielectric film 117 is deposited by using a plasma CVD apparatus, a second interlevel dielectric film 217 is formed in this embodiment by using an applicator. The second interlevel dielectric film 217 may be an organic film made of organic poly-siloxane or an organic material containing fluorine, or an inorganic porous film, for example. Many of these materials have fluidity.

First, as shown in FIG. 3A, the material is applied onto the first interlevel dielectric film 104, the interconnecting metal 109 and the line-to-line spaces 214. In this manner, the recesses in the line-to-line spaces 214 are filled in with the fluid material, thereby forming the second interlevel dielectric film 217 without any air gap. As the material of the second interlevel dielectric film 217, a material having a lower relative dielectric constant than that of the first interlevel dielectric film 104 is selected. Accordingly, the relative dielectric constant between adjacent lines 113A in the first interconnect layer 113 can be reduced at the line-to-line spaces 214. Subsequently, as shown in FIG. 3B, the surface of the second interlevel dielectric film 217 is planarized by a CMP technique such that the respective surfaces of the first interlevel dielectric film 104, the interconnecting metal 109 and the second interlevel dielectric film 217 form a single plane. In this embodiment, the first and second interlevel dielectric films 104 and 217 are made of different materials and the etching rate of the first interlevel dielectric film 104 is set smaller than that of the second interlevel dielectric film 217 during the CMP process. In this manner, the first interlevel dielectric film 104 is used as an etching stopper. Then, as shown in FIG. 3C, a metal layer formed by alternately stacking aluminum and a titanium alloy is deposited thereon and subjected to photolithography and dry etching, thereby forming a second interconnect layer 219.

As described above, in this embodiment, the line-to-line spaces 214 are entirely filled in with the second interlevel dielectric film 217 made of a material having a lower relative dielectric constant than that of the first interlevel dielectric film 104. Thus, the relative dielectric constant between adjacent lines 113A in the first interconnect layer 113 can be reduced at the line-to-line spaces 214. In addition, the relative dielectric constant can be determined based on the material of the second interlevel dielectric film 217.

In addition, since the first interconnect layer 113 is formed after the interconnecting metal 109 has been formed, the first interconnect layer 113 always exists under the entire bottom of the interconnecting metal 109. Accordingly, it is possible to prevent a contact failure from being caused between the first interconnect layer 113 and the interconnecting metal 109.

Moreover, after the interconnecting metal 109 has been filled in the interlevel contact hole 106 provided in the first interlevel dielectric film 104, the first interconnect layer 113 and the second interlevel dielectric film 217 are formed in this order. Accordingly, even if a mask-to-mask placement error has been caused during the formation of the first interconnect layer 113, either the interconnecting metal 109 or the first interlevel dielectric film 104 always exists on the upper surface of the first interconnect layer 113. And the second interlevel dielectric film 217 always exists in the line-to-line spaces 214. Accordingly, it is possible to prevent a shortcircuit failure from being caused between adjacent lines 113A in the first interconnect layer 113 or between a line 113A and the semiconductor substrate 101 through the interconnecting metal 109.

EMBODIMENT 3

Hereinafter, the third embodiment of the present invention will be described with reference to FIGS. 4A through 4D and FIG. 5. FIGS. 4A through 4D are cross-sectional views illustrating the flow of a process for fabricating a semiconductor device in this embodiment. The same process steps as those illustrated in FIGS. 1A through 1F are also performed prior to the process step shown in FIG. 4A, except that the thickness of a first interlevel dielectric film 304 is set larger (e.g., at 2.5 $\mu$m). Thus, the same components as those used in the first embodiment will be identified by the same reference numerals and the description thereof will be omitted herein.

Figure 4A:
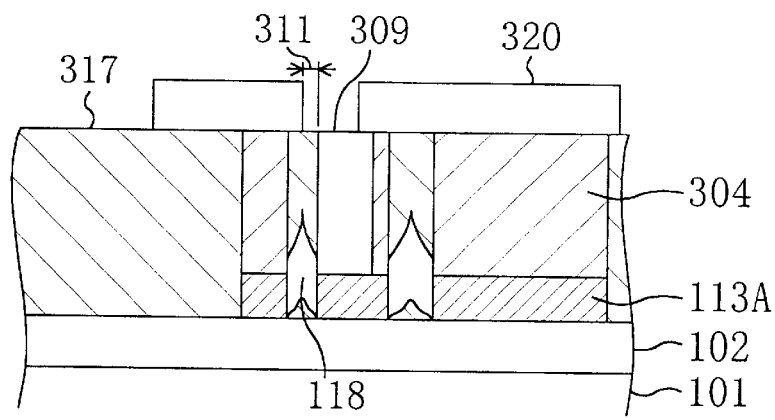
FIGS. 4A through 4D are cross-sectional views illustrating the flow of a process for fabricating a semiconductor device in the third embodiment of the present invention.
Figure 4B:
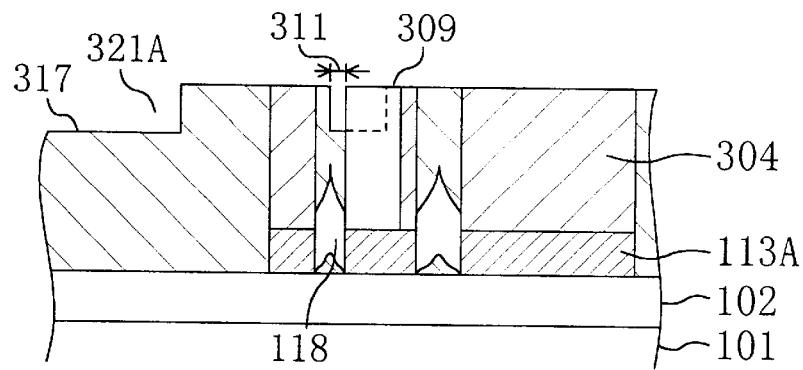
Figure 4C:
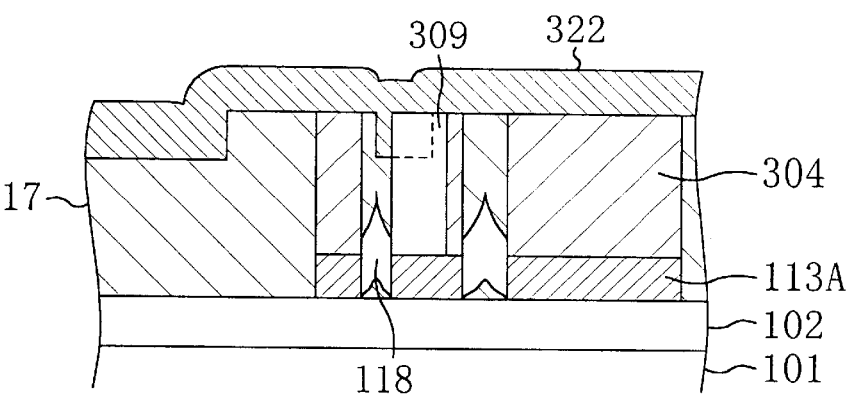
Figure 4D:
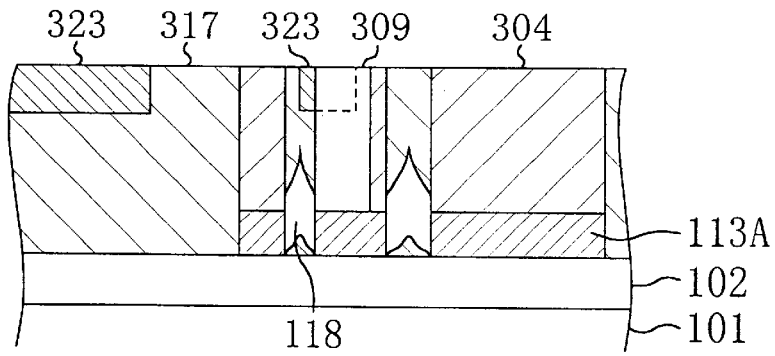

First, as shown in FIG. 4A, a second-interconnect inverted resist pattern 320 is formed by photolithography over the first interlevel dielectric film 304, an interconnecting metal 309 and a second interlevel dielectric film 317. Assume the second-interconnect inverted resist pattern 320 has been formed with an alignment error 311. If the diameter of the interlevel contact hole is 0.3 $\mu$m and the line width of a recess in the second-interconnect inverted resist pattern 320 is also 0.3 $\mu$m, then the maximum permissible alignment error 311 between the interconnecting metal 309 filled in the interlevel contact hole and the second-interconnect inverted resist pattern 320 is 0.1 $\mu$m. Next, as shown in FIG. 4B, the first and second interlevel dielectric films 304 and 317 are etched, thereby forming interconnect recesses 321A having a depth of 0.5 $\mu$m. Then, as shown in FIG. 4C, an adhesion layer (not shown) made of a titanium alloy is deposited on the recesses and a second metal layer 322 made of aluminum, an aluminum/copper alloy or copper is formed by vacuum evaporation, CVD or the like. Subsequently, as shown in FIG. 4D, the second metal layer 322 is removed by a CMP technique except for the portions existing in the interconnect recesses 321A to form a second interconnect layer 323.

Figure 5:
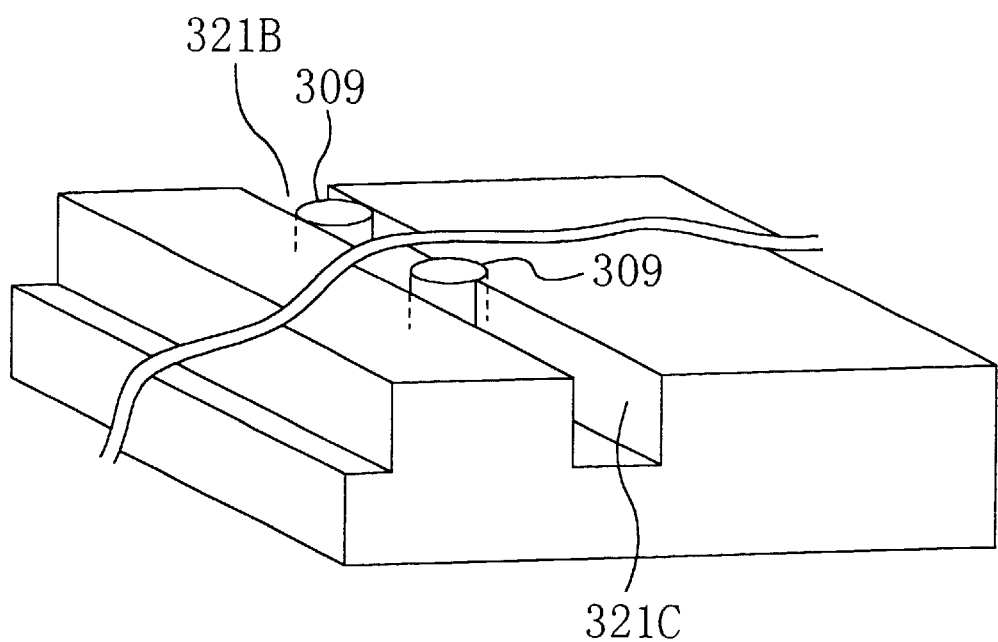
FIG. 5 is a perspective view illustrating how the positional relationship between an interconnect recess and an interconnecting metal changes with misalignment in the semiconductor device of the third embodiment.

Next, it will be described with reference to FIG. 5 and FIGS. 4B through 4D how the positional relationship between the second interconnect layer 323 and the interconnecting metal 309 changes owing to the misalignment of the second-interconnect inverted resist pattern 320. FIG. 5 is a perspective view illustrating how the positional relationship between the interconnect recesses 321A, where the second interconnect layer 323 is to be formed, and the interconnecting metal 309 changes with the mask-to-mask placement error. First, as to an interconnect recess 321B that has been formed by dry etching without having been misaligned, the interconnect recess 321B has a width equal to the diameter of the interconnecting metal 309. Since a line of the second interconnect layer 323 is formed inside the interconnect recess 321B, the interconnecting metal 309 and the line are in contact with each other over substantially the entire side face of the interconnecting metal 309. On the other hand, as to an interconnect recess 321C that has been formed by dry etching with an alignment error, the interconnect recess 321C, having a width equal to the diameter of the interconnecting metal 309, is formed with an alignment error 311 shown in FIG. 4B. Since the interconnecting metal 309 is not etched, the side face of the interconnecting metal 309 is exposed in the interconnect recess 321C except for the portion of the interconnecting metal 309 ingrown into the first interlevel dielectric film 304 by the alignment error 311. Accordingly, most of the side face of the interconnecting metal 309 comes into contact with the second metal layer 322 shown in FIG. 4C, and with the second interconnect layer 323 shown in FIG. 4D after CMP has been performed.

As described above, in this embodiment, even if the second-interconnect inverted resist pattern 320 used for forming the second interconnect layer 323 has been misaligned, most of the side face of the interconnecting metal 309 is in contact with the second interconnect layer 323. Accordingly, in this embodiment, not only the same effects as those of the first embodiment can be attained, but the reliability in connecting the interconnecting metal 309 to the second interconnect layer 323 can also be improved, even if the second-interconnect inverted resist pattern 320 has been misaligned.

EMBODIMENT 4

Hereinafter, a method for fabricating a semiconductor device in the fourth embodiment of the present invention will be described with reference to FIGS. 6A through 6I.

Figure 6A:
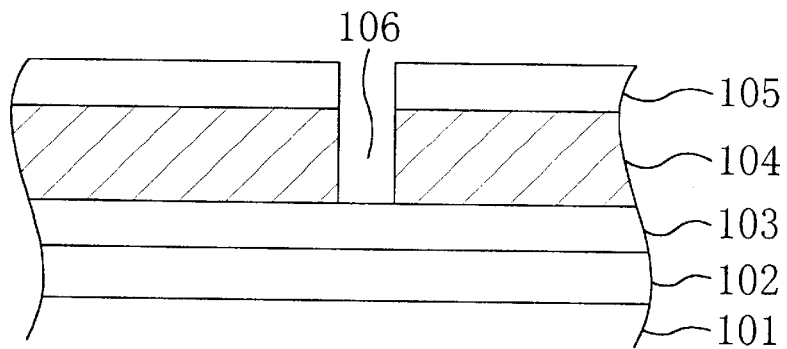
FIGS. 6A through 6I are cross-sectional views illustrating respective process steps for fabricating a semiconductor device in the fourth embodiment of the present invention.

First, as shown in FIG. 6A, an insulating film 102 (thickness: 0.8 $\mu$m), a first metal layer 103 formed by alternately stacking aluminum and a titanium alloy (thickness: 0.5 $\mu$m) and a first interlevel dielectric film 104 (thickness: 1.0 $\mu$m) are deposited in this order on a semiconductor substrate 101 on which a semiconductor active element (not shown) has been formed beforehand. Thereafter, an interconnecting resist pattern 105 is formed and an interlevel contact hole 106 is opened by dry etching.

Figure 6B:
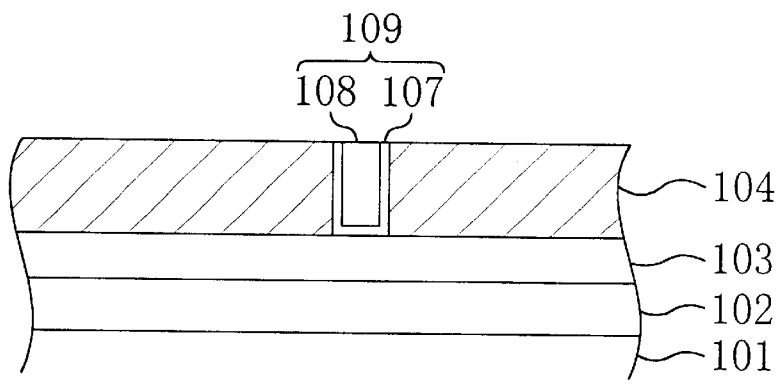

Next, as shown in FIG. 6B, the interconnecting resist pattern 105 is removed, and an adhesion layer 107 made of TiN/Ti, for example, is deposited over the entire surface of the substrate as well as over the inside of the interlevel contact hole 106. Then, an interconnecting material 108 such as tungsten is further deposited thereon by a blanket W-CVD technique. And the adhesion layer 107 and the interconnecting material 108 are removed by a dry etching or CMP technique except for the respective portions existing inside the interlevel contact hole 106. The portions of the adhesion layer 107 and the interconnecting material 108, existing only in the interlevel contact hole 106, constitute an interconnecting metal 109 altogether.

Figure 6C:
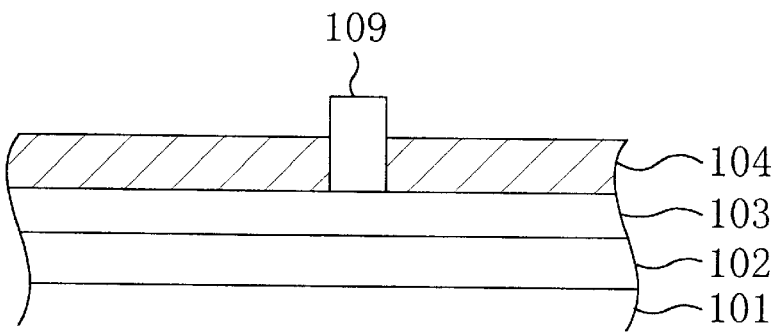

Subsequently, as shown in FIG. 6C, the first interlevel dielectric film 104 is etched by about 0.5 $\mu$m to adjust the thickness of the residual portion of the first interlevel dielectric film 104 at 0.5 $\mu$m. As a result, the interconnecting metal 109 protrudes upward from the surface of the first interlevel dielectric film 104.

Figure 6D:
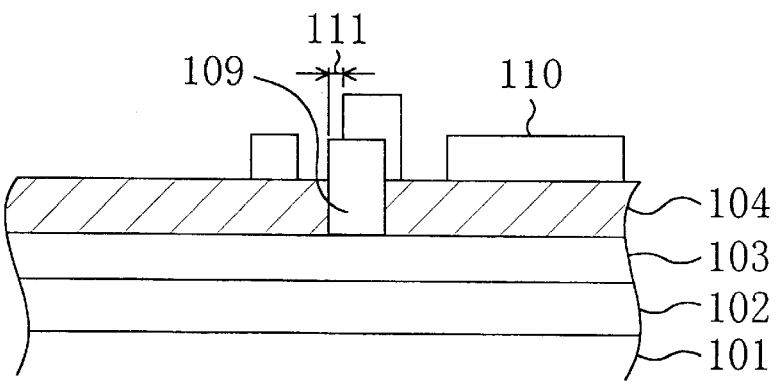

Then, as shown in FIG. 6D, a first-interconnect resist pattern 110 is formed over the first interlevel dielectric film 104 and the interconnecting metal 109. Assume the first-interconnect resist pattern 110 has been formed with an alignment error 111. If the diameter of the interlevel contact hole 106 is 0.3 μm and the line width of a recess in the first-interconnect resist pattern 110 is also 0.3 μm, then the maximum permissible alignment error 111 between the interconnecting metal 109, filled in the interlevel contact hole 106, and the first-interconnect resist pattern 110 is 0.1 μm.

FIG. 2A is a plan view illustrating how the positional relationship between the first-interconnect resist pattern 110 and the interconnecting metal 109 changes with the mask-to-mask placement error. In the lower part under the wave line in FIG. 2A, the position of the first-interconnect resist pattern 110 is misaligned with that of the interconnecting metal 109. On the other hand, in the upper part over the wave line in FIG. 2A, the position of the first-interconnect resist pattern 110 matches with that of the interconnecting metal 109.

Figure 6E:
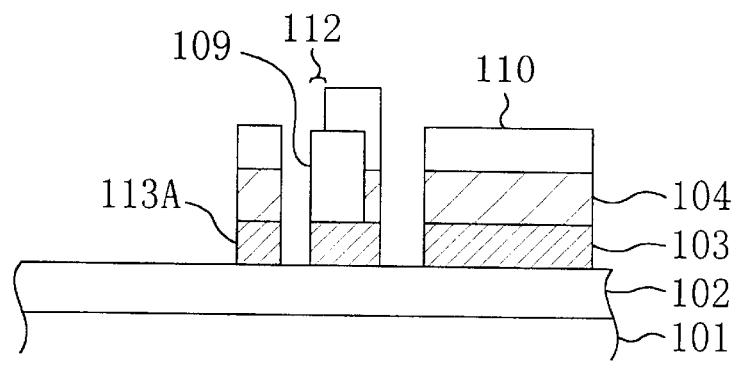

Next, as shown in FIG. 6E, the layers on the surface of the substrate, which are exposed through the openings of the first-interconnect resist pattern 110, are sequentially dry-etched by using a CF-based etching gas used for removing an oxide film and a Cl-based etching gas used for removing aluminum. First, parts of the first interlevel dielectric film 104, exposed through the openings of the first-interconnect resist pattern 110, are removed by dry etching using the CF-based etching gas at a low temperature. In this case, part of the interconnecting metal 109 corresponding to a misaligned portion 112 is not etched by the CF-based etching gas. Then, parts of the first metal layer 103, exposed through the openings of the first-interconnect resist pattern 110, are removed by dry etching using the Cl-based etching gas until the insulating film 102 is exposed. In this manner, the first-interconnect layer 113 is formed. The part of the interconnecting metal 109 corresponding to the misaligned portion 112 is not etched by the Cl-based etching gas, either.

FIG. 2B is a perspective view illustrating how the positional relationship between lines in the first interconnect layer 113 and the interconnecting metal 109 changes with the mask-to-mask placement error. First, as to a line 113B that has been formed out of the first metal layer 103 by dry etching without having been misaligned, the interconnecting metal 109 having a diameter equal to the width of the line 113B is formed on the upper surface of the line 113B. On the other hand, as to a line 113C that has been formed out of the first metal layer 103 by dry etching with an alignment error, part of the first metal layer 103 located under the interconnecting metal 109 is not etched during the dry etching. Accordingly, the part of the first metal layer 103 located under the interconnecting metal 109 is not etched but left in a self-aligned manner in the misaligned portion 112 shown in FIG. 6E. As a result, a line 113C is shaped as shown in FIG. 2B. Therefore, the line 113B or 113C (both identified by 113A in FIG. 6E) of the first interconnect layer 113 is formed without fail under the entire bottom of the interconnecting metal 109. Also, since the portions under the first-interconnect resist pattern 110 are not etched, the first interlevel dielectric film 104 remains as it is in the portions over the first interconnect layer 113 where the interconnecting metal 109 does not exist. That is to say, either the first interlevel dielectric film 104 or the interconnecting metal 109 always exists over the first interconnect layer 113.

Figure 6F:
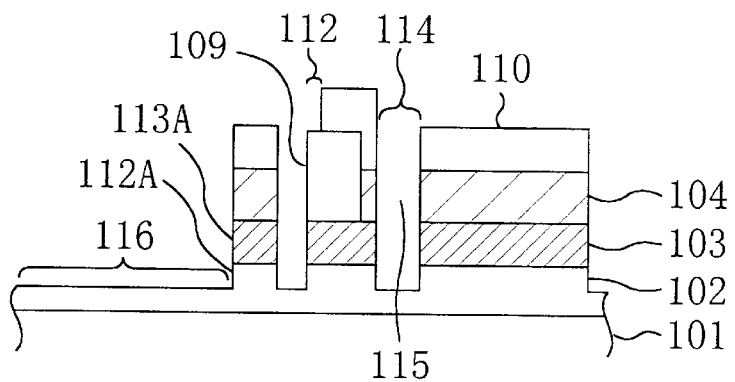

Next, as shown in FIG. 6F, the insulating film 102 is etched by about 0.5 μm in accordance with a dry etching technique using the CF-based etching gas. In this manner, the first interconnect layer 113 is formed to be sandwiched by upper and lower insulating films 102 and 104. In FIG. 6F, the non-etched portions of the insulating film 102 immediately under the lines 113A in the first interconnect layer 113 are identified by 112A. Accordingly, the first metal layer 103, existing under the interconnecting metal 109 or the first interlevel dielectric film 104, constitutes the first interconnect layer 113.

The total thickness of the first interconnect layer 113, formed out of the first metal layer 103, the first interlevel dielectric film 104 and the insulating film 112A is 1.5 μm. Thus, the aspect ratio of a recess 115 formed in a line-to-line space 114, which is a region between adjacent lines 113A in the first interconnect layer 113 and has the minimum width of 0.3 μm, is about five. It is noted that a dummy interconnect pattern may be formed in a field portion 116 where the first interconnect layer 113 does not exist.

Figure 6G:
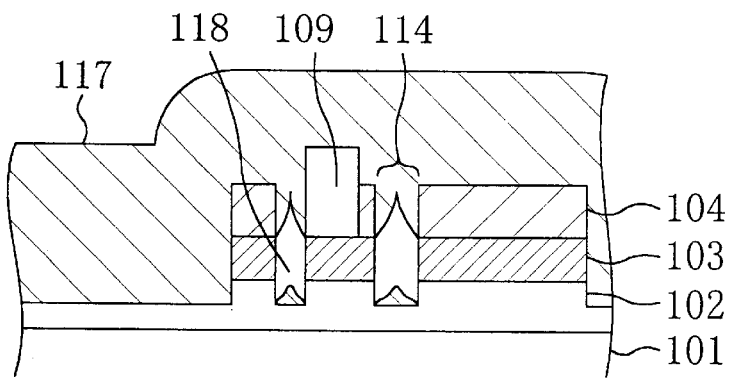
Figure 6H:
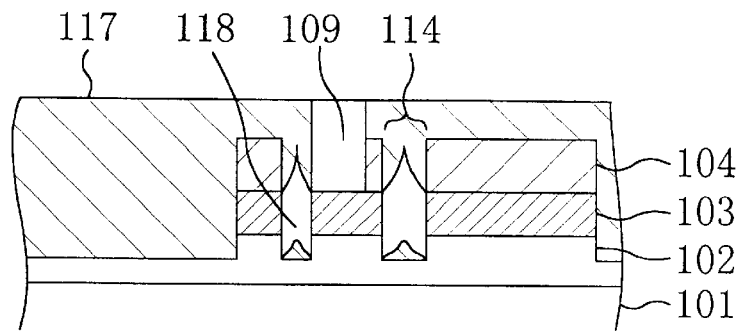
Figure 6I:
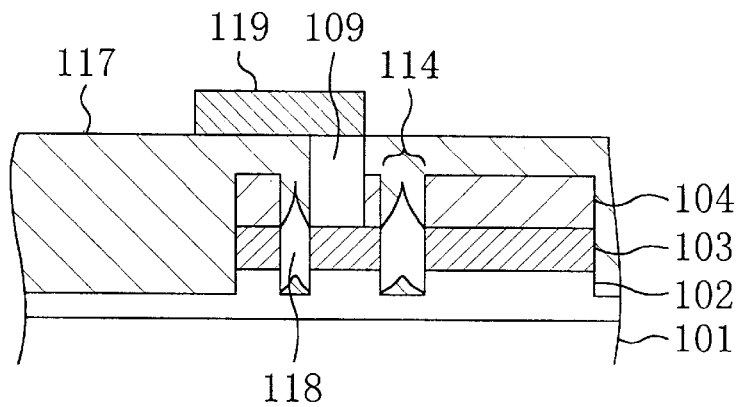

Next, as shown in FIG. 6G, the first-interconnect resist pattern 110 is removed. Then, a second interlevel dielectric film 117 is deposited over the insulating film 102, the first interlevel dielectric film 104 and the interconnecting metal 109 on the semiconductor substrate 101 by using a plasma CVD apparatus. A recess 115 formed in a line-to-line space 114 is partially or entirely not filled in with the second interlevel dielectric film 117, but turned into an air gap 118. In a recess having a high aspect ratio, in particular, the entire region of the line-to-line space 114 is turned into an air gap 118. Subsequently, as shown in FIG. 6H, the surface of the second interlevel dielectric film 117 is planarized by a CMP technique such that the respective surfaces of the interconnecting metal 109 and the second interlevel dielectric film 117 form a single plane. Even in a recess having a high aspect ratio, the upper part thereof is filled in with the second interlevel dielectric film 117 to a certain degree. Accordingly, no opening is formed over any air gap 118 through the surface of the second interlevel dielectric film 117 after CMP is finished. Then, as shown in FIG. 6I, a metal layer formed by alternately stacking aluminum and a titanium alloy is deposited thereon and subjected to photolithography and dry etching, thereby forming a second interconnect layer 119.

Hereinafter, it will be described with reference to FIGS. 7A and 7B and FIGS. 8A and 8B how the shape of an air gap changes with the manner in which the second interlevel dielectric film 117 is deposited.

Figure 7A:
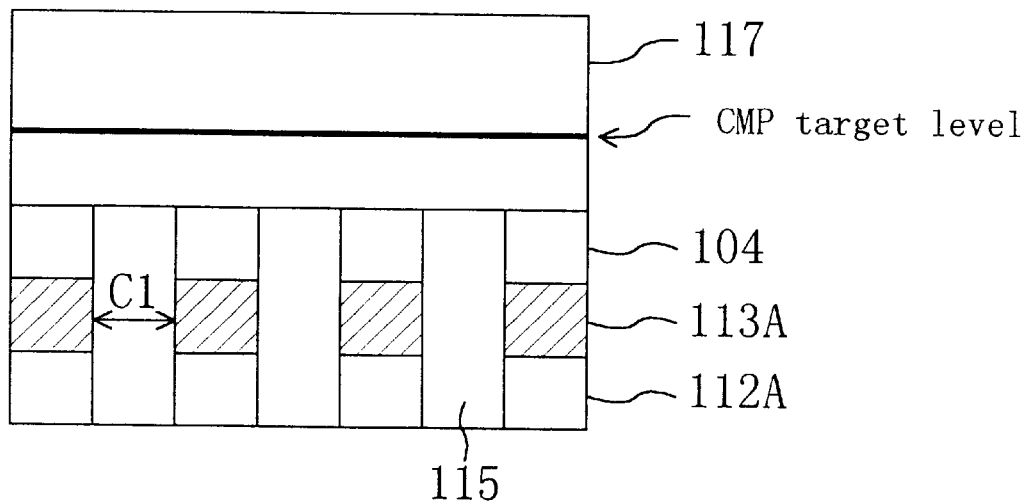
FIGS. 7A and 7B are cross-sectional views illustrating a shape of air gaps.

First, FIG. 7A will be referred to. FIG. 7A illustrates an ideal state where the second interlevel dielectric film 117 has not ingrown into the recesses 115 at all and the recesses 115 are entirely occupied by air gaps. In this case, since no dielectric exists between adjacent lines 113A, the line-to-line capacitance Cl is very small. Also, in FIG. 7A, the upper end of an air gap is not higher than the upper surface of the first interlevel dielectric film 104. Accordingly, even after the surface of the second interlevel dielectric film 117 has been polished by CMP, the air gaps are less likely to be exposed. If the air gaps communicate with the outside through the polished surface of the second interlevel dielectric film 117 subjected to the CMP process, then the function of the interlevel dielectric film 117 is lost and shortcircuit possibly happens between lines.

Figure 7B:
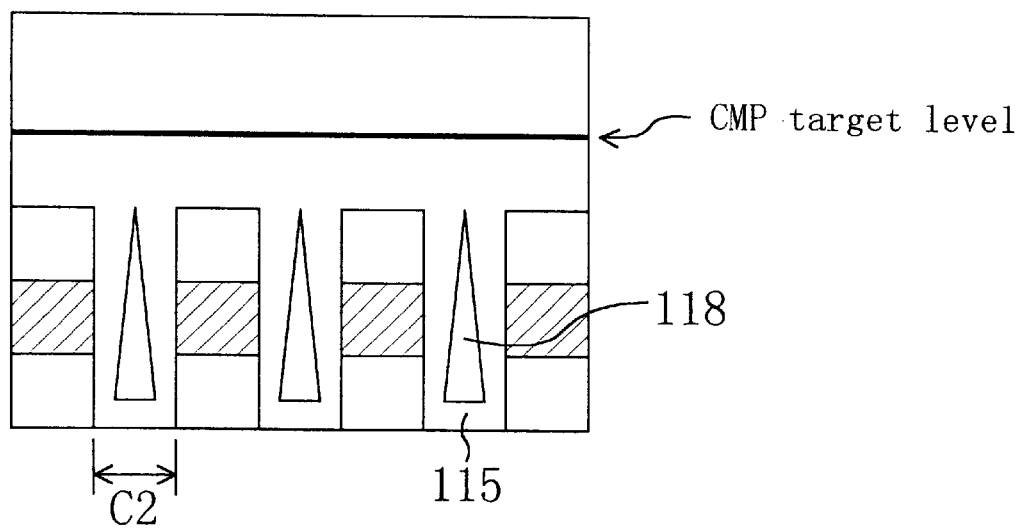

FIG. 7B illustrates a state where the second interlevel dielectric film 117 has been deposited on the bottom and side faces of the recesses 115 and a small part of each recess 115 is occupied by an air gap. Such a state is established if the second interlevel dielectric film 117 has been deposited with satisfactory step coverage. For example, in performing plasma CVD using TEOS as a source material, before the upper part of a recess 115 is completely filled in with the second interlevel dielectric film 117 being deposited, the interlevel dielectric film having a certain thickness is deposited on the bottom and side faces of the recess 115. As a result, the capacitance C2 between adjacent lines 113A adversely increases.

Figure 8A:
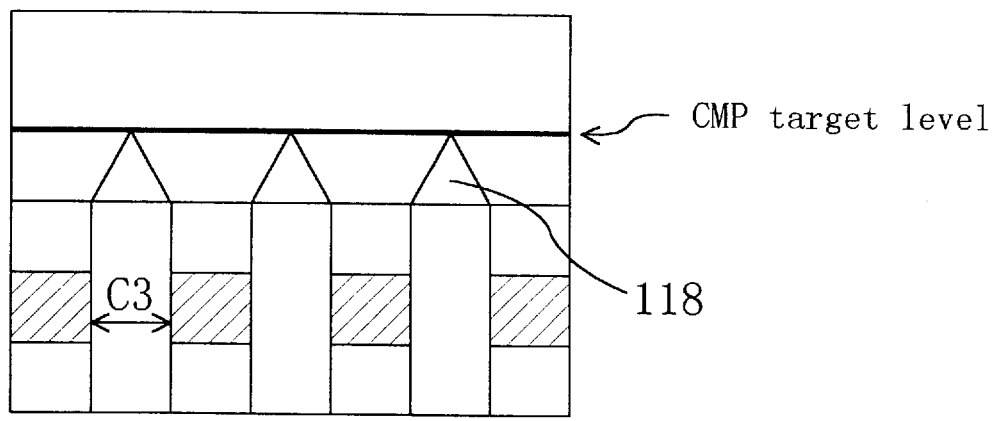
FIGS. 8A and 8B are cross-sectional views illustrating other shapes of air gaps.

FIG. 8A illustrates a state where the second interlevel dielectric film 117 has not ingrown into the recesses 115 at all and the upper part 118 of an air gap reaches a higher level than the upper surface of the first interlevel dielectric film 104. Such a state is established if the second interlevel dielectric film 117 has been deposited with poor step coverage and high directivity. For example, if the second interlevel dielectric film 117 is a so-called "high-density plasma (HDP) film", the air gaps such as those shown in FIG. 8A are obtained. In this case, since no dielectric is deposited inside the recesses 115, the capacitance C3 between adjacent lines 113A is smaller.

Figure 8B:
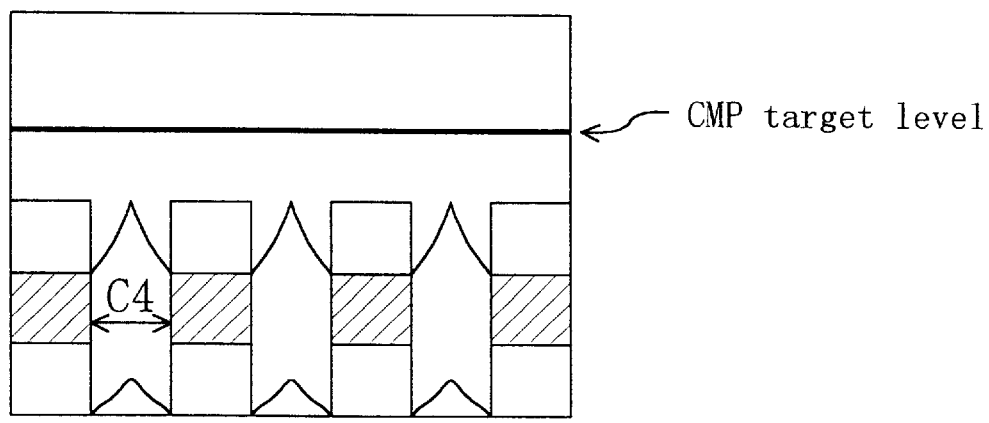

An HDP film is formed by using an HDP apparatus. If an HDP film is deposited in an HDP apparatus with a bias voltage applied to the substrate, an etching phenomenon also happens in competition with the deposition. As a result, the dielectric film is deposited on the bottom of the recesses and the upper end of an air gap does not exceed the upper surface of the first interlevel dielectric film 104. The air gaps in such a shape are shown in FIG. 8B. If the HDP film, which has been deposited with a bias voltage applied to the substrate, is used as the second interlevel dielectric film, only a small amount of dielectric is deposited on the bottom of the recesses. However, if the insulating film, which is an underlying layer of the first interconnect layer, has been etched, the deposited dielectric is located at a lower level than that of the first interconnect layer. Accordingly, the capacitance between the lines 113A remains low.

Figure 9A:
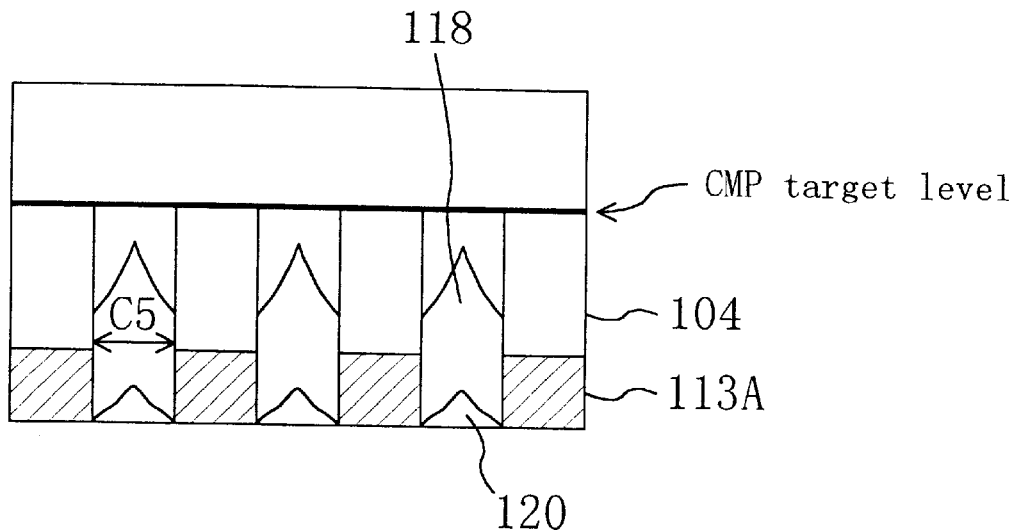
FIGS. 9A and 9B are cross-sectional views illustrating still other shapes of air gaps.
Figure 9B:
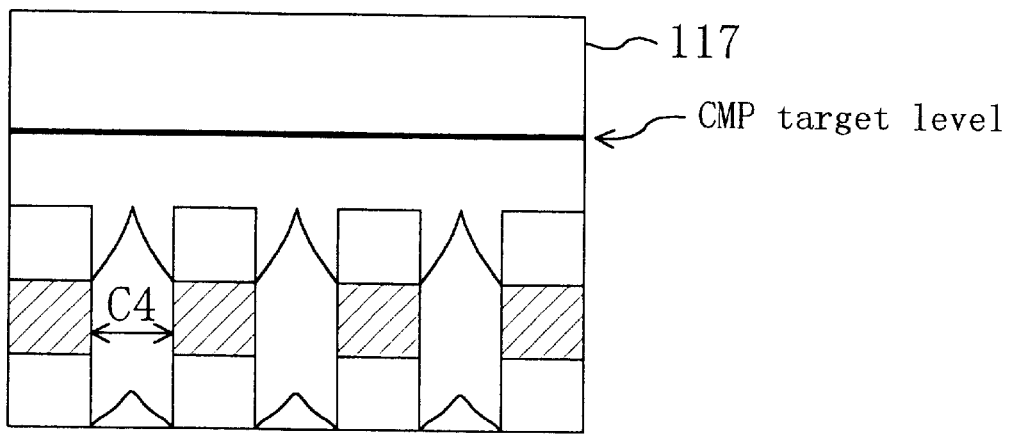

Thus, if the process step of etching the insulating film 102 has been performed as shown in FIG. 6F, the capacitance C4 between the lines 113A is kept low, even though a small amount of dielectric has been deposited on the bottom of the recesses. This point will be further described with reference to FIGS. 9A and 9B. FIG. 9A illustrates the shape of air gaps where the process step of etching the insulating film 102 has not been performed, while FIG. 9B illustrates the shape of air gaps where the process step of etching the insulating film 102 has been performed. In FIG. 9A, if a dielectric has been deposited on the bottom of the recesses, then the capacitance C5 is larger than the capacitance C4 because the dielectric exists between adjacent lines. Accordingly, in forming the second interlevel dielectric film in accordance with a deposition method for forming the air gaps in such shapes as those shown in FIGS. 7B and 8B, it is preferable to make the bottom of the recesses lower than the first interconnect layer 113 by performing the process step of etching the insulating film 102.

In order to reduce the line-to-line capacitance, the air gaps of such a shape as shown in FIG. 8B are most preferable. However, if such air gaps are formed, it is highly probable that the second interlevel dielectric film is planarized and etched by CMP to the level on which the upper end of the air gaps is located. Nevertheless, if the interconnecting metal 109 is formed to protrude upward from the upper surface of the first interlevel dielectric film 104, the chemical/mechanical polishing can be stopped at the level of the upper surface of the interconnecting metal 109. That is to say, the interconnecting metal 109 can function as a kind of etching stopper layer. In such a case, it is easy to control the CMP process such that the polished and etched surface is located higher than the upper end of the air gaps. Accordingly, even if the air gaps of the shape shown in FIG. 8A have been formed, problems are less likely to happen. Also, if the air gaps of the shape shown in FIG. 8A are formed, the necessity of etching the insulating film 102 is relatively low. However, if the insulating film 102 has been etched, the line-to-line capacitance C3 can be lower as compared with the case where the insulating film 102 has not been etched at all. The reason is as follows. The line-to-line capacitance is determined by the physical properties of a space of a certain dimension located between two adjacent lines. Accordingly, since the line-to-line capacitance is also affected by the relative dielectric constants of spaces over and under the space adjoining the lines, the insulating film is preferably etched.

Considering these points, it can be understood that partially etching the insulating film 102 at the spaces between adjacent lines 113A is advantageous in reducing the line-to-line capacitance for various shapes of air gaps.

As described above, in this embodiment, part or all of a line-to-line space 114 is turned into an air gap 118. Accordingly, the relative dielectric constant between lines 113A in the first interconnect layer 113 can be reduced at the line-to-line space 114. In particular, when a recess 115 formed in a line-to-line space 114 has a high aspect ratio, the entire region of the line-to-line space 114 is turned into an air gap 118. As a result, the relative dielectric constant between the lines 113A can be minimized.

In addition, since the first interconnect layer 113 is formed after the interconnecting metal 109 has been formed, the first interconnect layer 113 always exists under the entire bottom of the interconnecting metal 109. Accordingly, it is possible to prevent a contact failure from being caused between the first interconnect layer 113 and the interconnecting metal 109.

Moreover, after the interconnecting metal 109 has been filled in the interlevel contact hole 106 provided in the first interlevel dielectric film 104, the first interconnect layer 113 and the second interlevel dielectric film 117 are formed in this order. Accordingly, even if a mask-to-mask placement error has been caused during the formation of the first interconnect layer 113, either the interconnecting metal 109 or the first interlevel dielectric film 104 always exists on the upper surface of the first interconnect layer 113. And the interconnecting metal 109 is never filled in any air gap 118 formed simultaneously with the second interlevel dielectric film 117. Accordingly, it is possible to prevent a shortcircuit failure from being caused between adjacent lines 113A in the first interconnect layer 113 or between a line 113A and the semiconductor substrate 101 through the interconnecting metal 109.

EMBODIMENT 5

Hereinafter, the fifth embodiment of the present invention will be described with reference to FIGS. 10A through 10D illustrating the flow of a process for fabricating a semiconductor device in this embodiment. The same process steps as those illustrated in FIGS. 1A through 1D and FIGS. 6E and 6F are also performed prior to the process step shown in FIG. 10A. Thus, the same components as those used in the first embodiment will be identified by the same reference numerals and the description thereof will be omitted herein. Unlike the first embodiment in which the second interlevel dielectric film 117 is deposited by using a plasma CVD apparatus, a second interlevel dielectric film 212 is formed in this fifth embodiment by using an applicator. The second interlevel dielectric film 212 may be an organic film made of organic poly-siloxane or an organic material containing fluorine, or an inorganic porous film, for example. Many of these materials have fluidity.

Figure 10A:
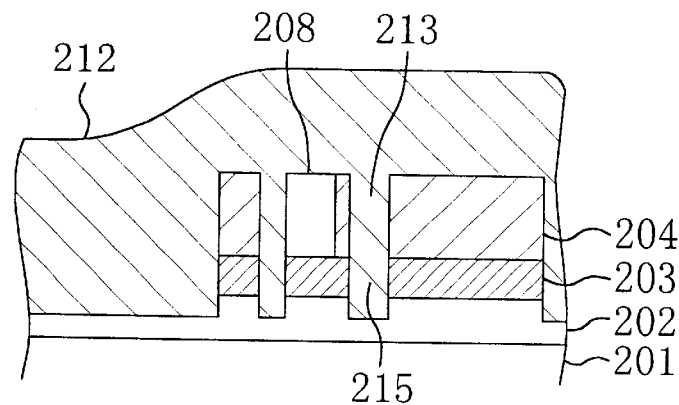
FIGS. 10A through 10D are cross-sectional views illustrating respective process steps for fabricating a semiconductor device in the fifth embodiment of the present invention.
Figure 10B:
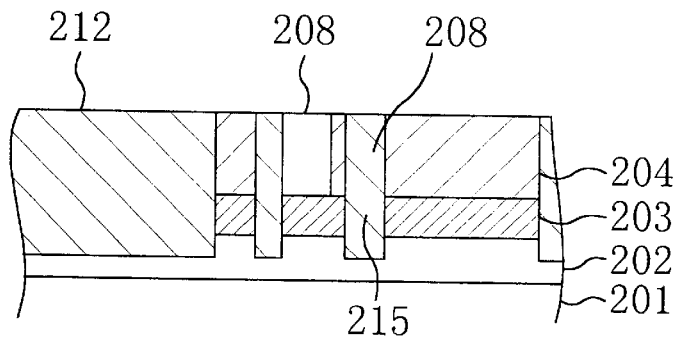

First, as shown in FIG. 10A, the material is applied onto a first interlevel dielectric film 204, an interconnecting metal 208 and the line-to-line spaces 215 formed on the semiconductor substrate 201. In this manner, the recesses in the line-to-line spaces 215 are filled in with the fluid material, thereby forming the second interlevel dielectric film 212 without any air gap. As the material of the second interlevel dielectric film 212, a material having a lower relative dielectric constant than that of the first interlevel dielectric film 204 is selected. Accordingly, the relative dielectric constant between adjacent lines in the first interconnect layer 203 can be reduced at the line-to-line spaces 215. Subsequently, as shown in FIG. 10B, the surface of the second interlevel dielectric film 212 is planarized by a CMP technique such that the respective surfaces of the first interlevel dielectric film 204, the interconnecting metal 208 and the second interlevel dielectric film 212 form a single plane. In this embodiment, the first and second interlevel dielectric films 204 and 212 are made of different materials and the etching rate of the first interlevel dielectric film 204 is set smaller than that of the second interlevel dielectric film 212 during the CMP process. In this manner, the first interlevel dielectric film 204 is used as an etching stopper.

Figure 10C:
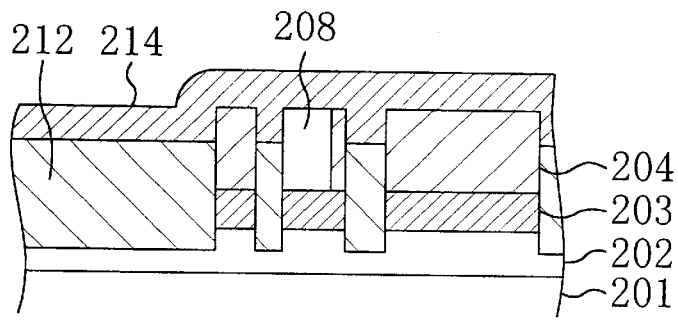

Then, as shown in FIG. 10C, only the second interlevel dielectric film 212 is selectively etched in the depth direction by about 0.3 µm, and a third interlevel dielectric film 214 is deposited to be about 0.5 µm thick. And then the surface of the third interlevel dielectric film 214 is planarized again by a CMP technique such that the respective surfaces of the first interlevel dielectric film 204, the interconnecting metal 208 and the third interlevel dielectric film 214 form a single plane.

Figure 10D:
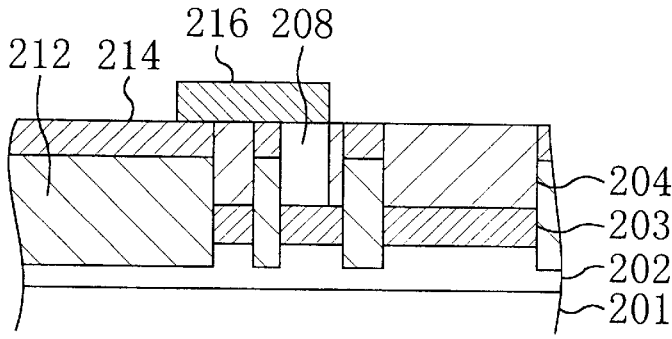

Next, as shown in FIG. 10D, a metal layer formed by alternately stacking aluminum and a titanium alloy is deposited thereon and subjected to photolithography and dry etching, thereby forming a second interconnect layer 216.

As described above, in this embodiment, the line-to-line spaces 215 are entirely filled in with the second interlevel dielectric film 212 made of a material having a lower relative dielectric constant than that of the first interlevel dielectric film 204. Thus, the relative dielectric constant between adjacent lines in the first interconnect layer 203 can be reduced at the line-to-line spaces 215. In addition, the relative dielectric constant can be determined based on the material of the second interlevel dielectric film 212.

In addition, since the first interconnect layer 203 is formed after the interconnecting metal 208 has been formed, the first interconnect layer 203 always exists under the entire bottom of the interconnecting metal 208. Accordingly, it is possible to prevent a contact failure from being caused between the first interconnect layer 203 and the interconnecting metal 208.

Moreover, after the interconnecting metal 208 has been filled in the interlevel contact hole provided in the first interlevel dielectric film 204, the first interconnect layer 203 and the second interlevel dielectric film 212 are formed in this order. Accordingly, even if a mask-to-mask placement error has been caused during the formation of the first interconnect layer 203, either the interconnecting metal 208 or the first interlevel dielectric film 204 always exists on the upper surface of the first interconnect layer 203. And the second interlevel dielectric film 212 always exists in the line-to-line spaces 215. Accordingly, it is possible to prevent a shortcircuit failure from being caused between adjacent lines in the first interconnect layer 203 or between a line and the semiconductor substrate 201 through the interconnecting metal 208.

In this embodiment, parts of the insulating film 202 located in the line-to-line spaces between adjacent lines in the first interconnect layer 203 are also etched. Accordingly, the line-to-line capacitance is substantially determined by the relative dielectric constant of the second interlevel dielectric film 212. If the parts of the insulating film 202 located in the line-to-line spaces between adjacent lines in the first interconnect layer 203 are not etched, then the parts of the insulating film 202 located in the vicinity of the line-to-line spaces between adjacent lines in the first interconnect layer 203 increase the line-to-line capacitance to a certain degree.

Moreover, in this embodiment, the third interlevel dielectric film 214 is formed. Accordingly, even if a material poorly resistant to etching or plasma is used for the second interlevel dielectric film 212, the second interlevel dielectric film 212 is not damaged during the process step of forming the second interconnect layer 216. Thus, the third interlevel dielectric film 214 is preferably made of a material highly resistant to etching or plasma. Even if the relative dielectric constant of the third interlevel dielectric film 214 increases because of the selection of such a material, the line-to-line capacitance of the first interconnect layer 203 is not increased.

In the embodiment illustrated in FIGS. 10A through 10D, no air gaps are formed in the line-to-line spaces 215. Alternatively, air gaps may be formed in the line-to-line spaces 215.

EMBODIMENT 6

In the sixth embodiment, the same process steps as those of the fifth embodiment are performed before the second interlevel dielectric film is formed. The sixth embodiment is characterized by the process step of forming the second interlevel dielectric film. Hereinafter, the process step of forming the second interlevel dielectric film will be described in detail with reference to FIGS. 11A through 11C.

Figure 11A:
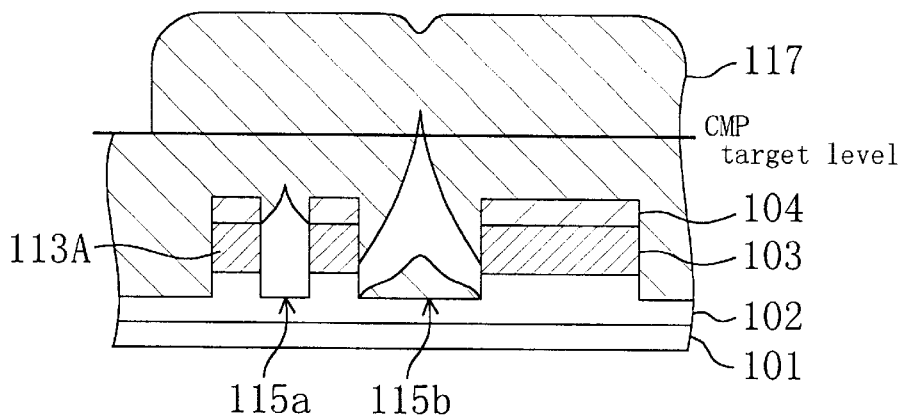
FIGS. 11A through 11C are cross-sectional views illustrating respective process steps for fabricating a semiconductor device in the sixth embodiment of the present invention.
Figure 11B:
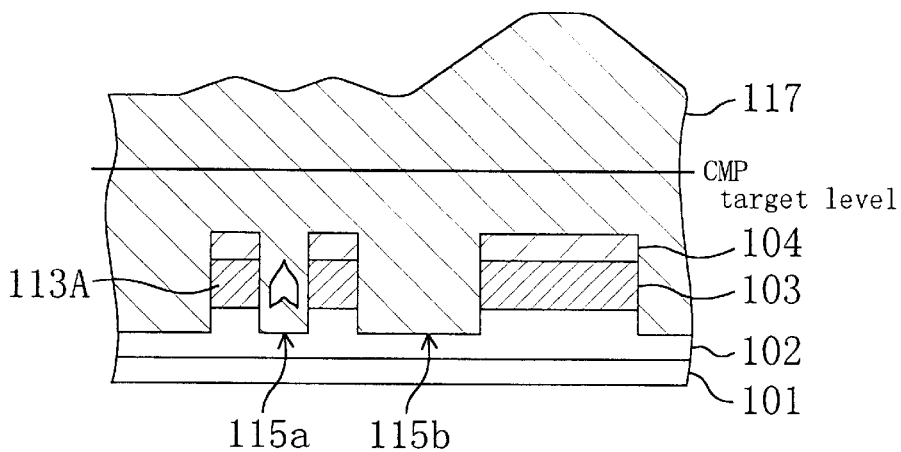
Figure 11C:
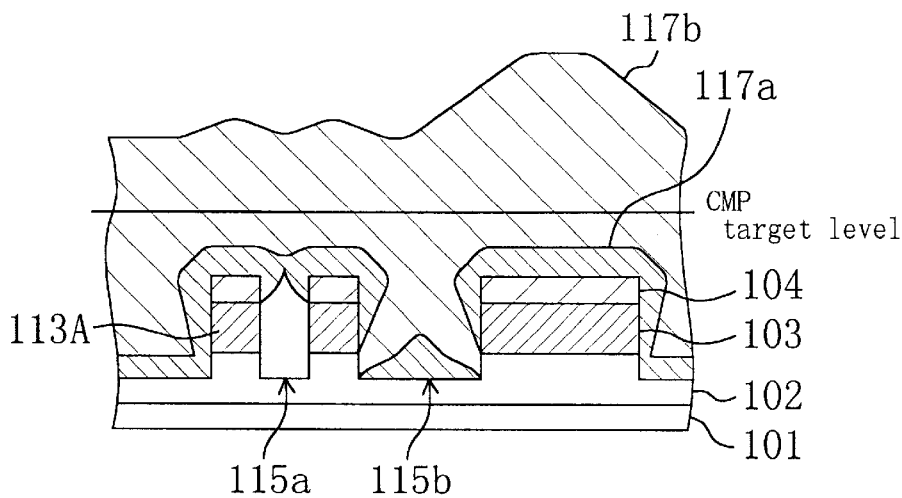

FIGS. 11A through 11C illustrate a region where a relatively narrow recess 115a having a width of 0.5 µm or less and a relatively broad recess 115b having a width larger than 0.5 µm (e.g., 0.8 µm or more) have been formed. In particular, FIGS. 11A and 11B show the cross sections, in each of which the second interlevel dielectric film 117 is made of a single type of film. In the example shown in FIG. 11A, an insulating film with relatively poor step coverage has been deposited. Examples of such films with poor step coverage include a plasma-oxidized film formed in a parallel-plate plasma CVD apparatus by using silane/$N_2O$-based gas plasma. If such a film is used, then air gaps are formed in both of the recesses 115a and 115b. In the relatively broad recess 115b, a large air gap is formed. Accordingly, the upper end of the air gap in the recess 115b possibly exceeds the resulting level of the second interlevel dielectric film 117 at which CMP is to be stopped (in this specification, such a level will be called a "CMP target level"). If such a large air gap has been formed, the air gap is possibly exposed through the polished surface after the CMP process is finished. In such a case, a disconnection or shortcircuit failure of the second interconnect layer may happen.

On the other hand, in the example shown in FIG. 11B, a dielectric film, which can generally fill in a gap rather satisfactorily, has been deposited as the second interlevel dielectric film 117. Examples of such a film include a plasma-oxidized film formed by using high-density plasma (HDP). If such a film is used, then the second interlevel dielectric film 117 is deposited on the bottom and side faces of the relatively narrow recess 115a. As a result, an air gap of the size smaller than that of the recess 115a is formed in the recess 115a. On the other hand, the relatively broad recess 115b is filled in with the second interlevel dielectric film 117 and no air gap is observed therein. The HDP film is formed by using an HDP apparatus. If the HDP film is deposited in the HDP apparatus with a bias voltage applied to the substrate, an etching phenomenon also happens in competition with deposition. As a result, the dielectric film is deposited on the bottom of the recess and the gap can be filled in with the film more satisfactorily. In this case, the upper end of an air gap does not reach the CMP target level. However, since a smaller air gap is formed in the recess 115a, the line-to-line capacitance is not reduced so much.

In the embodiment shown in FIG. 1C, in order to attain the advantages of these two types of films at the same time, the second interlevel dielectric film 117 is made up of dielectric layers formed by at least two different methods. Specifically, first, the upper part of the relatively narrow recess 115a is substantially covered with a first interlevel dielectric layer 117a and then the other relatively broad recess 115b is filled in with a second interlevel dielectric layer 117b. In particular, the first interlevel dielectric layer 117a is formed in a parallel-plate plasma CVD apparatus by using silane/$N_2$O-based gas plasma and then the second interlevel dielectric layer 117b is deposited in an HDP apparatus with a bias voltage applied to the substrate. The first and second interlevel dielectric layers 117a and 117b are made of silicon dioxide, for example. Alternatively, the second interlevel dielectric layer 117b may be an organic coating film (made of polyarylether, for example) having a low relative dielectric constant. The first interlevel dielectric layer 117a may be formed using silane, oxygen and argon gases at a pressure of 5 mTorr.

If the width of an air gap (i.e., the ratio of the air gap to a line-to-line space) is increased, the upper end of the air gap becomes higher. The width and height of an air gap can be optimized by adjusting the thicknesses of the first and second interlevel dielectric layers 117a and 117b.

Next, the results of evaluation performed on the multilevel interconnect structure formed in this embodiment will be described.

Figure 12A:
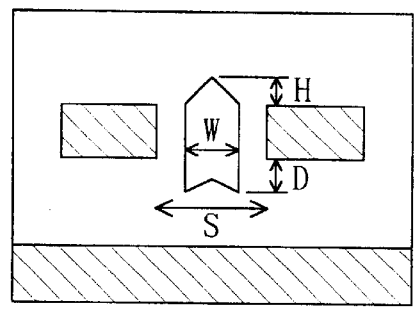
FIG. 12A is a cross-sectional view and FIGS. 12B and 12C are graphs showing the respective sizes of an air gap in the sixth embodiment.
Figure 12B:
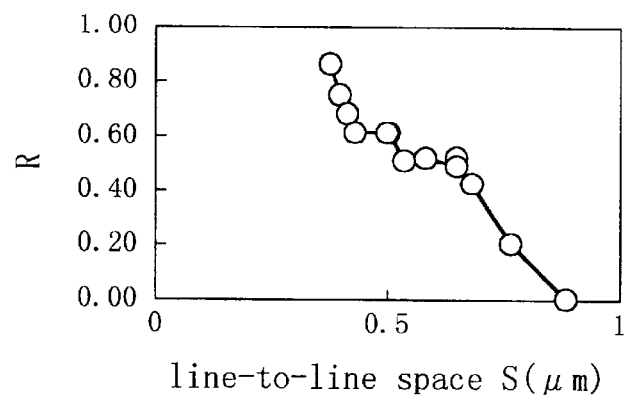
Figure 12C:
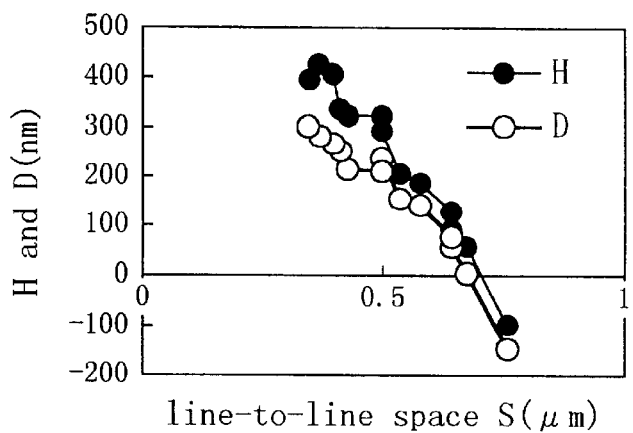

First, FIGS. 12A through 12C will be referred to. FIG. 12A illustrates a positional relationship between a line-to-line space and an air gap. In FIG. 12A, H denotes a distance between the upper surface of the first interconnect layer and the top of the air gap, and D denotes a distance between the lower surface of the first interconnect layer and the bottom of the air gap. The occupancy ratio R is the ratio of the width W of the air gap to the line-to-line space S.

FIG. 12B illustrates the dependence of the occupancy ratio R of the air gap on the line-to-line space S. If S is equal to or smaller than 0.8 μm, the occupancy ratio R of the air gap is a positive value larger than zero. The smaller the line-to-line space S is, the larger the occupancy ratio R is. When S=0.3 μm, the occupancy ratio R is about 0.9.

FIG. 12C illustrates the dependence of the distances H and D on the line-to-line space S. The value of H never exceeds 500 nm at any value of the line-to-line space S, and never reaches the CMP target level (in the range from 800 nm to 1000 nm above the interconnect layer). In other words, even after the interlevel dielectric film 117 has been planarized by a CMP technique, the air gap is not exposed. Thus, the yield of the second interconnect layer does not decrease.

Figure 13:
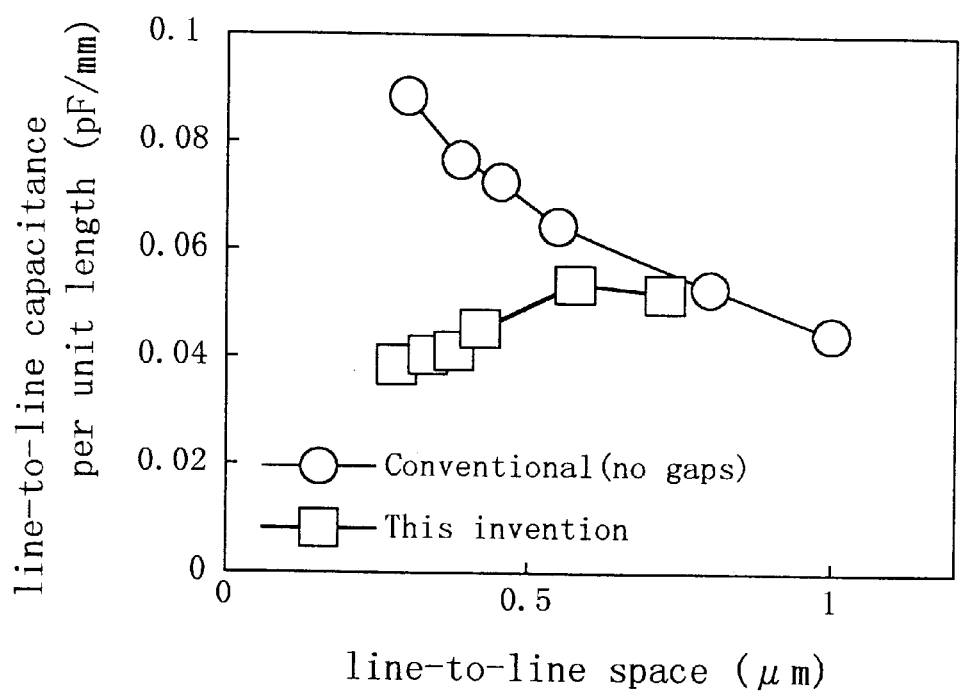
FIG. 13 is a graph illustrating a relationship between a line-to-line space and line-to-line capacitance per unit length in one embodiment of the semiconductor device according to the present invention.

Next, it will be described with reference to FIG. 13 how the line-to-line capacitance is effectively reduced in the multilevel interconnect structure formed in this embodiment. In FIG. 13, data about a conventional multilevel interconnect structure in which no air gaps are formed between adjacent lines is represented by open circles as a comparative example. In the comparative example, the smaller the line-to-line space is, the larger the line-to-line capacitance per unit length is. However, in this embodiment, as the line-to-line space decreases, the line-to-line capacitance also decreases to the contrary. The line-to-line capacitance decreases presumably because the occupancy ratio R of the air gap to the line-to-line space increases as the line-to-line space decreases.

Figure 14A:
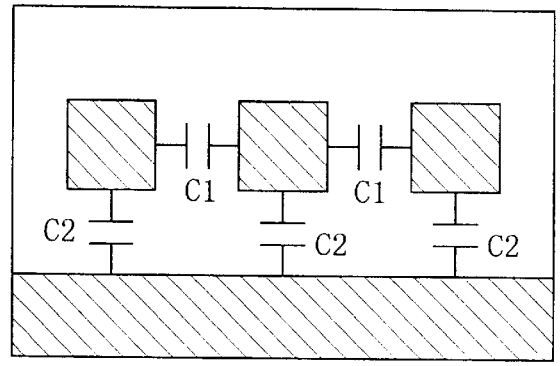
FIG. 14A is a cross-sectional view of an interconnect structure used for calculating the line-to-line capacitance of a semiconductor device.
Figure 14B:
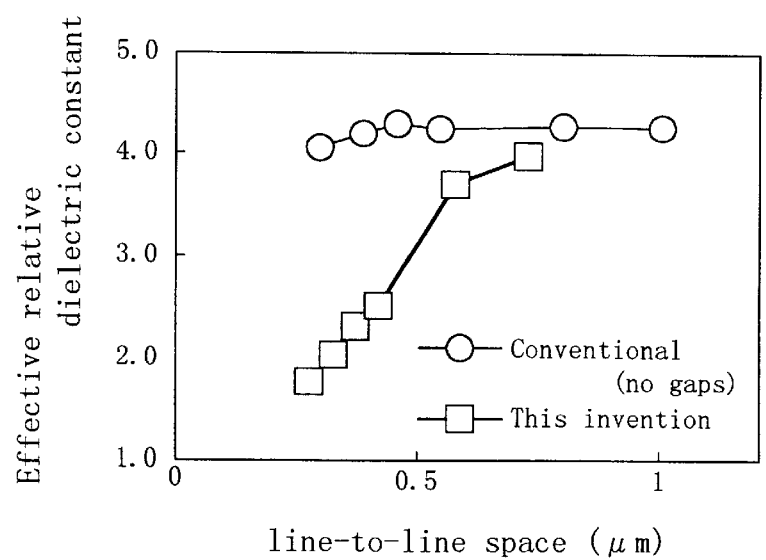
FIG. 14B is a graph illustrating a relationship between a line-to-line space and an effective relative dielectric constant.

Next, with reference to FIGS. 14A and 14B, the reduction of the line-to-line capacitance in accordance with this embodiment will be compared to the reduction of the line-to-line capacitance accomplished by the use of an interlevel dielectric film having a low relative dielectric constant.

FIG. 14A is a cross-sectional view illustrating the configuration of a model used for calculation (or simulation). FIG. 14B illustrates the dependence of an effective relative dielectric constant on a line-to-line space. The effective relative dielectric constant is determined by calculating the line-to-line capacitance (per unit length) generated when a uniform medium having a certain relative dielectric constant is used as the interlevel dielectric film and then by comparing the capacitance to the actually measured capacitance. As represented by the open squares in FIG 14B, in this embodiment, the smaller the line-to-line space is, the smaller the effective relative dielectric constant is. If the line-to-line space is 0.8 μm or less, an air gap is formed in the line-to-line space. And if an air gap is formed, the effective relative dielectric constant drastically decreases. When the line-to-line space is 0.3 μm, the effective relative dielectric constant is as low as about 1.8.

Figure 15:
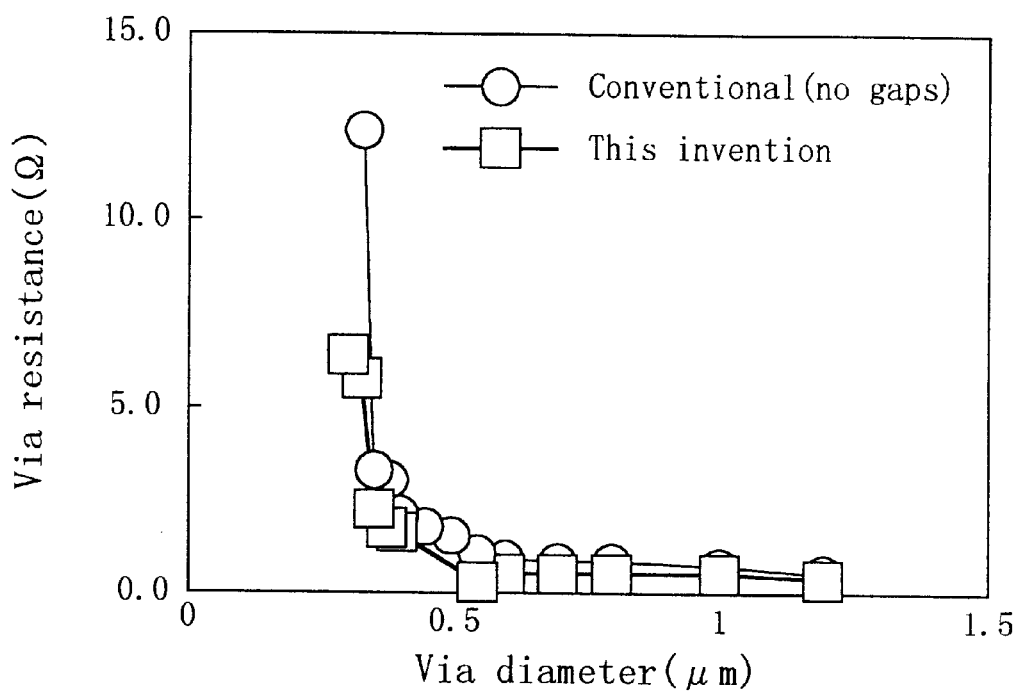
FIG. 15 is a graph illustrating a relationship between the diameter of a via and the resistance of the via in one embodiment of the semiconductor device according to the present invention.

FIG. 15 illustrates a relationship between the resistance of an interconnecting metal (i.e., via resistance) and the diameter of the interconnecting metal (i.e., via diameter). As can be understood if this embodiment is compared to the comparative example in which no air gaps are formed, via resistance values are not different so much in both cases.

Figure 16:
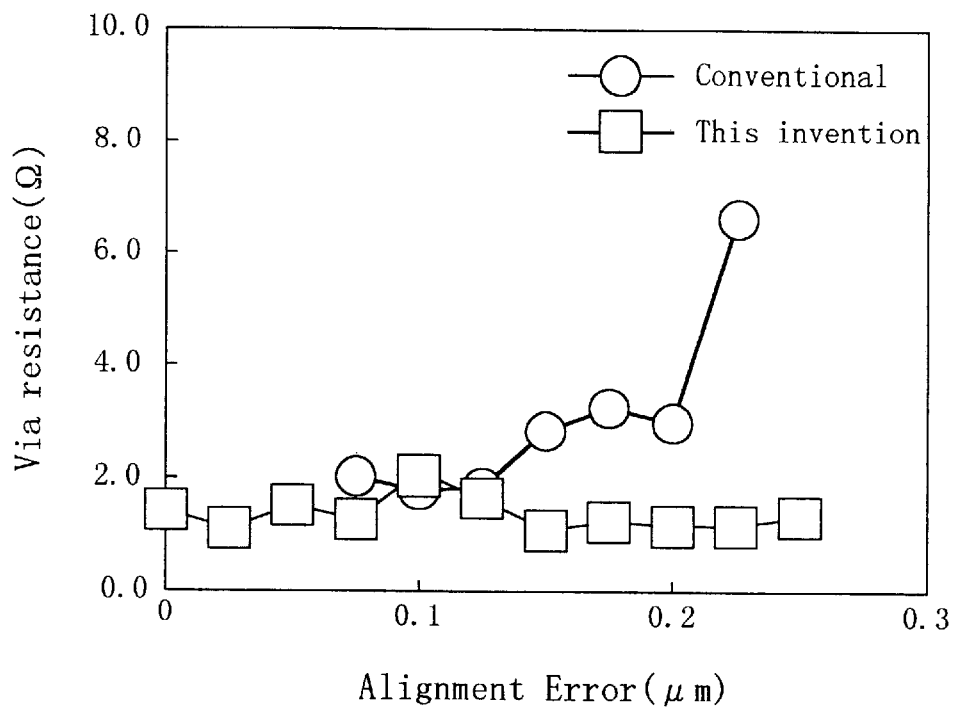
FIG. 16 is a graph illustrating a relationship between an alignment error and the resistance of a via in one embodiment of the semiconductor device according to the present invention, the alignment error being a distance between a line in the first interconnect layer and the misaligned via.
Figure 17:
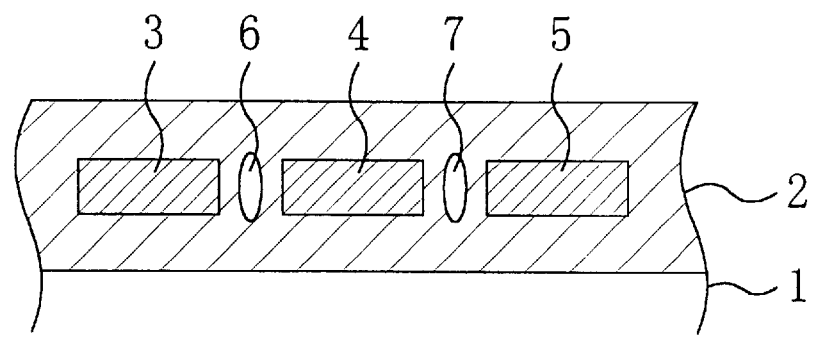
FIG. 17 is a cross-sectional view illustrating the structure of a conventional semiconductor device.
Figure 18A:
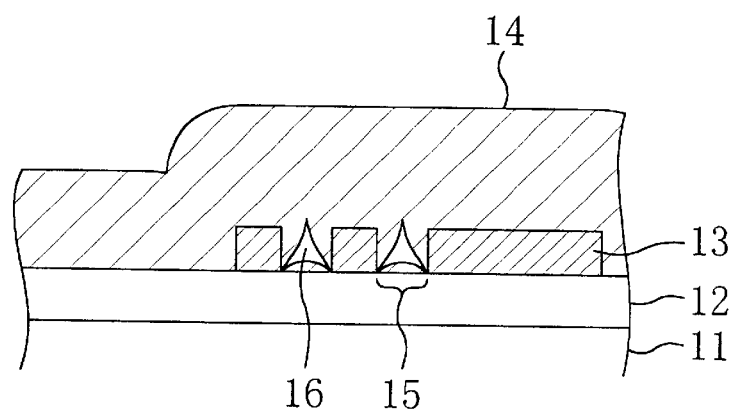
FIGS. 18A through 18E are cross-sectional views illustrating the flow of a process for fabricating a conventional semiconductor device.
Figure 18B:
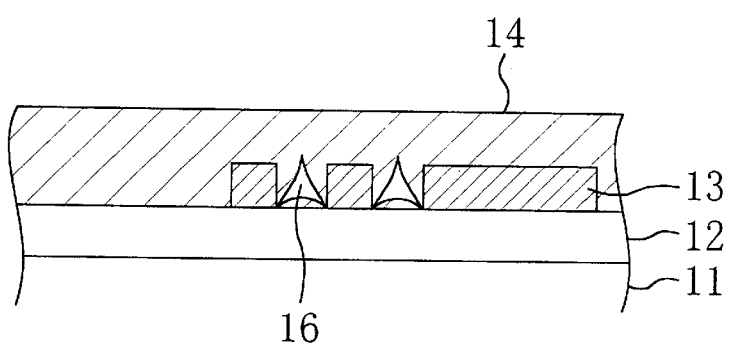
Figure 18C:
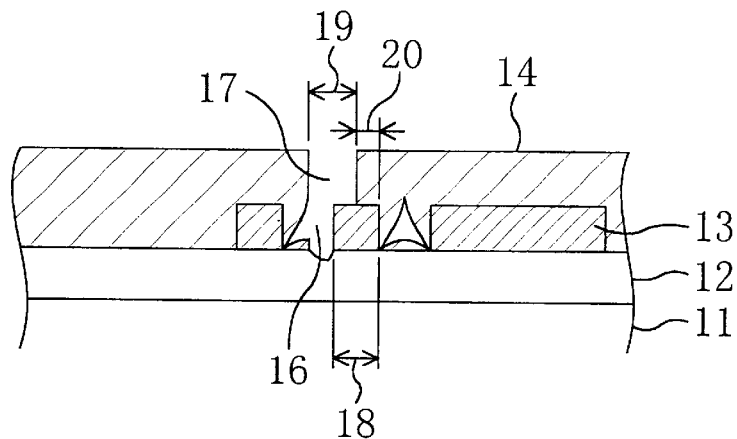
Figure 18D:
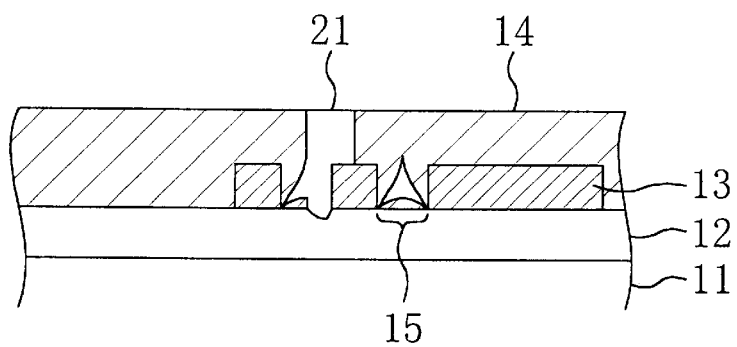
Figure 18E:
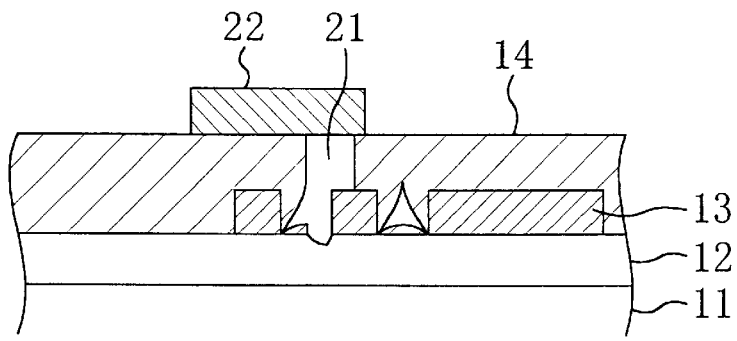

FIG. 16 illustrates the dependence of a via resistance value on an alignment error between the first interconnect layer and the interconnecting metal. The "alignment error" herein denotes the magnitude of the misalignment between the interconnecting metal and the first interconnect layer. Since the width of a line-to-line space in the first interconnect layer is equal to the via diameter in the pattern used for measurement, there is no overlap margin between the first interconnect layer and the interconnecting metal. As can be understood from FIG. 16, in the conventional example, the larger the alignment error is, the higher the via resistance is. By contrast, in this embodiment, the via resistance remains substantially the same irrespective of the via resistance. The reason is as follows. Even if misalignment has been caused, the contact area between the first interconnect layer and the interconnecting metal is kept at a maximum value, because the interconnecting metal always exists on the upper surface of the first interconnect layer.

Since the second interlevel dielectric film 117 is deposited after the interconnecting metal 109 has been formed, the air gaps, formed simultaneously with the deposition of the second interlevel dielectric film 117, do not come into contact with the interconnecting metal 109. Accordingly, neither a shortcircuit failure between adjacent lines 113A in the first interconnect layer 113 nor a shortcircuit failure between a line 113A and the semiconductor substrate 101 is caused through the interconnecting metal 109.

The material of the first interconnect layer is not limited to Al. Alternatively, the first interconnect layer may be made of Cu, for example. Instead of a plasma oxide film, an applied insulating film, which can fill in a gap satisfactorily, may also be used as the second interlevel dielectric layer of the second interlevel dielectric film 117 Also, desirable effects can be attained even if the method for forming the second interlevel dielectric film, described with reference to FIG. 11C, is applied to any other embodiment of the present invention.

According to the present invention, the first interconnect layer always exists under the entire bottom of the interconnecting metal. Accordingly, even if misalignment has been caused during the formation of the first interconnect layer, it is possible to prevent a contact failure from being caused between the first interconnect layer and the interconnecting metal. In addition, the interconnecting metal is not filled into the air gaps that are formed simultaneously with the second interlevel dielectric film. Thus, it is possible to prevent a shortcircuit failure from being caused between adjacent lines in the first interconnect layer or between a line and the semiconductor substrate through the interconnecting metal.

If part or all of a line-to-line space is turned into an air gap or if the line-to-line space is entirely filled in with a material having a low relative dielectric constant, the relative dielectric constant between adjacent lines can be reduced at the line-to-line space. As a result, a semiconductor device, which operates with a larger margin and is less likely to operate erroneously, is realized by reducing a signal delay between the lines in the first interconnect layer.

Moreover, since most of the side face of the interconnecting metal is in contact with the second interconnect layer, reliability in connecting the interconnecting metal to the second interconnect layer can also be improved even if misalignment has been caused during the formation of the second interconnect layer.

Furthermore, even if misalignment has been caused during the formation of the first interconnect layer, either the interconnecting metal or the first interlevel dielectric film always exists on the upper surface of the first interconnect layer. In addition, the interconnecting metal is not filled into the air gaps that are formed simultaneously with the second interlevel dielectric film. Thus, it is possible to prevent a shortcircuit failure from being caused between adjacent lines in the first interconnect layer or between a line and the semiconductor substrate through the interconnecting metal.

What is claimed is:

1. A method for fabricating a semiconductor device having a multilevel interconnection structure, comprising the steps of:

covering a surface of a substrate with an insulating film;

depositing a conductive film on the insulating film;

forming a first interlevel dielectric film on the conductive film;

forming an interlevel contact hole in the first interlevel dielectric film so as to reach the conductive film;

filling in the interlevel contact hole with an interconnecting metal;

forming a masking layer, defining a pattern of a first interconnect layer, on the first interlevel dielectric film so as to cover at least part of the interconnecting metal;

forming the first interconnect layer out of the conductive film by etching the first interlevel dielectric film using the masking layer as a mask and by etching the conductive film using the masking layer and the interconnecting metal as a mask;

removing the masking layer;

depositing a second interlevel dielectric film over the substrate so as to cover the interconnecting metal and the first interconnect layer;

planarizing the second interlevel dielectric film, thereby exposing at least part of the interconnecting metal; and forming a second interconnect layer to be electrically connected to an upper part of the interconnecting metal.

2. A method for fabricating a semiconductor device having a multilevel interconnection structure, comprising the steps of:

covering a surface of a substrate with an insulating film;

depositing a conductive film on the insulating film;

forming a first interlevel dielectric film on the conductive film;

forming an interlevel contact hole in the first interlevel dielectric film so as to reach the conductive film;

filling in the interlevel contact hole with an interconnecting metal;

partially etching the first interlevel dielectric film from the surface thereof to make an upper end portion of the interconnecting metal protrude from the first interlevel dielectric film;

forming a masking layer, defining a pattern of a first interconnect layer, on the first interlevel dielectric film so as to cover at least part of the interconnecting metal;

forming the first interconnect layer out of the conductive film by etching the first interlevel dielectric film using the masking layer as a mask and by etching the conductive film using the masking layer and the interconnecting metal as a mask;

removing the masking layer;

depositing a second interlevel dielectric film over the substrate so as to cover the interconnecting metal and the first interconnect layer;

planarizing the second interlevel dielectric film, thereby exposing at least part of the interconnecting metal; and forming a second interconnect layer to be electrically connected to an upper part of the interconnecting metal.

3. The method of claim 1 or 2, wherein the conductive film is etched such that the interconnecting metal is substantially not etched.

4. The method of claim 1 or 2, wherein in the step of forming the second interlevel dielectric film, air gaps are formed in respective line-to-line spaces between lines in the first interconnect layer, each of the air gaps being a closed region where the second interlevel dielectric film does not exist.

5. The method of claim 4, wherein in the step of planarizing the second interlevel dielectric film, the air gaps are not exposed.

6. The method of claim 1 or 2, wherein a dielectric constant of a material used for the second interlevel dielectric film is smaller than a dielectric constant of a material used for the first interlevel dielectric film.

7. The method of claim 4, wherein the step of forming the second interlevel dielectric film comprises the steps of:

forming a first interlevel dielectric layer as part of the second interlevel dielectric film; and forming a second interlevel dielectric layer as the other part of the second interlevel dielectric film on the first interlevel dielectric layer, and wherein in the step of forming the first interlevel dielectric layer, some of the line-to-line spaces, which are formed in the first interconnect layer and have a width of 0.5 μm or less, are substantially covered with the first interlevel dielectric layer such that air gaps are formed in the spaces having the width of 0.5 μm or less, and wherein in the step of forming the second interlevel dielectric layer, part of the second interlevel dielectric layer enters the spaces in the first interconnect layer that are not substantially covered with the first interlevel dielectric layer.

8. The method of claim 7, wherein a first plasma CVD film, formed by using silane/$N_2O$-based gas plasma, is used as the first interlevel dielectric layer.

9. The method of claim 7, wherein a second plasma CVD film, formed by using high-density plasma in which a bias voltage is applied to the substrate, is used as the second interlevel dielectric layer.

10. The method of claim 1 or 2, wherein the step of forming the first interconnect layer comprises the step of forming a recess in the surface of the insulating film by etching part of the insulating film underlying the conductive film after the first interlevel dielectric film and the conductive film have been etched using the masking layer as a mask.

11. The method of claim 1 or 2, wherein the step of forming the second interconnect layer comprises the steps of:

forming a recess in the surface of the first interlevel dielectric film by etching at least the first interlevel dielectric film using a recess-forming pattern as a mask;

forming a second metal layer on the interconnecting metal, the first interlevel dielectric film and the second interlevel dielectric film; and forming the second interconnect layer by removing the second metal layer except for a portion thereof existing inside the recess.

12. A method for fabricating a semiconductor device having a multilevel interconnection structure, comprising the steps of:

forming a structure including: a lower-level interconnect layer composed of a plurality of lines that are formed on the same insulating film and include first, second and third lines; and a first interlevel dielectric film formed on the first, second and third lines, the second line being adjacent to and spaced apart from the first line by a first space, the third line being adjacent to and spaced apart from the first line by a second space wider than the first space;

depositing a first interlevel dielectric layer as a lower part of a second interlevel dielectric film such that an upper part of the first space is substantially covered with the first interlevel dielectric layer and that an air gap is formed in the first space; and depositing a second interlevel dielectric layer, the coverage of which is more satisfactory than that of the first interlevel dielectric layer, as an upper part of the second interlevel dielectric film to fill in the second space and totally cover the air gap.

13. The method of claim 12, further comprising the step of planarizing the second interlevel dielectric layer such that the air gap is not exposed.

14. The method of claim 12, wherein the second interlevel dielectric layer is made of an organic film having a lower dielectric constant than that of the first interlevel dielectric layer.

* * * * *